United States Patent
Han et al.

(10) Patent No.: US 10,587,223 B2
(45) Date of Patent: Mar. 10, 2020

(54) DEVICE FOR TERAHERTZ SIGNAL GENERATION AND TRANSMITTER

(71) Applicant: Cornell University, Ithaca, NY (US)

(72) Inventors: Ruonan Han, Cambridge, MA (US); Ehsan Afshari, Ithaca, NY (US)

(73) Assignee: Cornell University, Ithaca, NY (US)

( * ) Notice: Subject to any disclaimer, the term of this patent is extended or adjusted under 35 U.S.C. 154(b) by 19 days.

(21) Appl. No.: 15/552,339

(22) PCT Filed: Feb. 22, 2016

(86) PCT No.: PCT/US2016/018991
§ 371 (c)(1),
(2) Date: Aug. 21, 2017

(87) PCT Pub. No.: WO2016/134384
PCT Pub. Date: Aug. 25, 2016

(65) Prior Publication Data
US 2018/0041166 A1    Feb. 8, 2018

Related U.S. Application Data

(60) Provisional application No. 62/119,100, filed on Feb. 20, 2015.

(51) Int. Cl.
*H03B 5/18* (2006.01)
*H03B 5/12* (2006.01)

(52) U.S. Cl.
CPC ......... *H03B 5/1847* (2013.01); *H03B 5/1215* (2013.01); *H03B 5/1231* (2013.01); *H03B 2200/007* (2013.01); *H03B 2200/0008* (2013.01); *H03B 2200/0062* (2013.01); *H03B 2200/0076* (2013.01); *H03B 2200/0084* (2013.01)

(58) Field of Classification Search
CPC .......... H03B 2200/0084; H03B 5/1231; H03B 5/1847
See application file for complete search history.

(56) References Cited

U.S. PATENT DOCUMENTS

| | | | |
|---|---|---|---|
| 2013/0082785 A1* | 4/2013 | Afshari | H03B 28/00 331/48 |
| 2014/0166868 A1 | 6/2014 | Tekin et al. | |
| 2015/0084709 A1* | 3/2015 | Sanduleanu | H03B 5/1215 331/132 |
| 2016/0294324 A1* | 10/2016 | Rieh | H03B 5/1212 |

OTHER PUBLICATIONS

Han, R., et al., A CMOS High-Power Broadband 260-GHz Radiator Array for Spectroscopy, IEEE Journal of Solid-State Circuits, Jul. 29, 2013, vol. 48, No. 12, pp. 3090-3104. http://www.mtl.mit.edu/wpmu/han/files/2014/07/2013_JSSC_260GHz_Source.pdf.

* cited by examiner

*Primary Examiner* — Jeffrey M Shin
(74) *Attorney, Agent, or Firm* — Hodgson Russ LLP

(57) ABSTRACT

A high-power transmitter with a fully-integrated phase locking capability is disclosed and characterized. Also provided herein is a THz radiator structure based on a return-path gap coupler, which enables the high-power generation of the disclosed transmitter, and a self-feeding oscillator suitable for use with the transmitter.

16 Claims, 18 Drawing Sheets

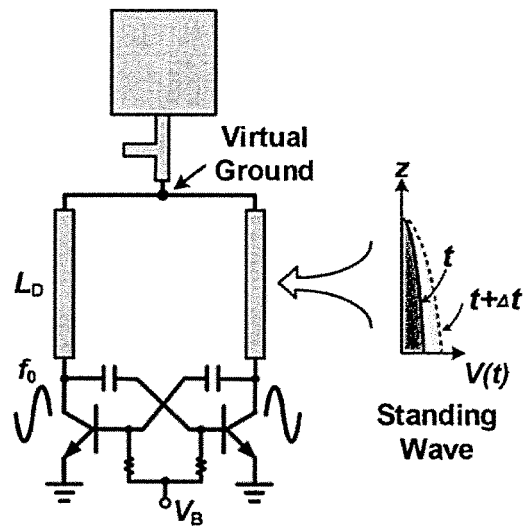
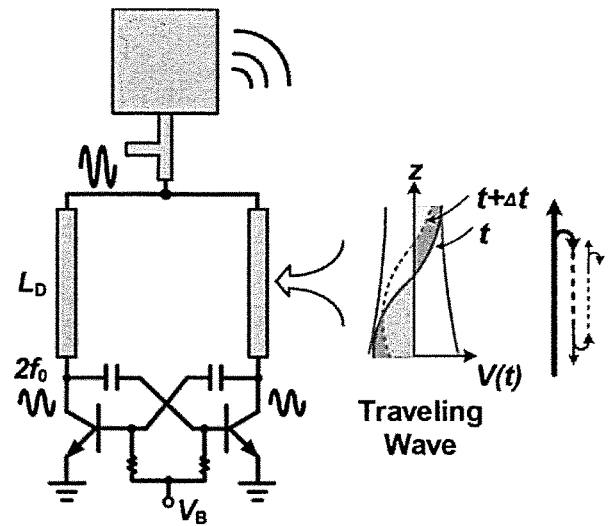
Fig. 5A
Fig. 5B
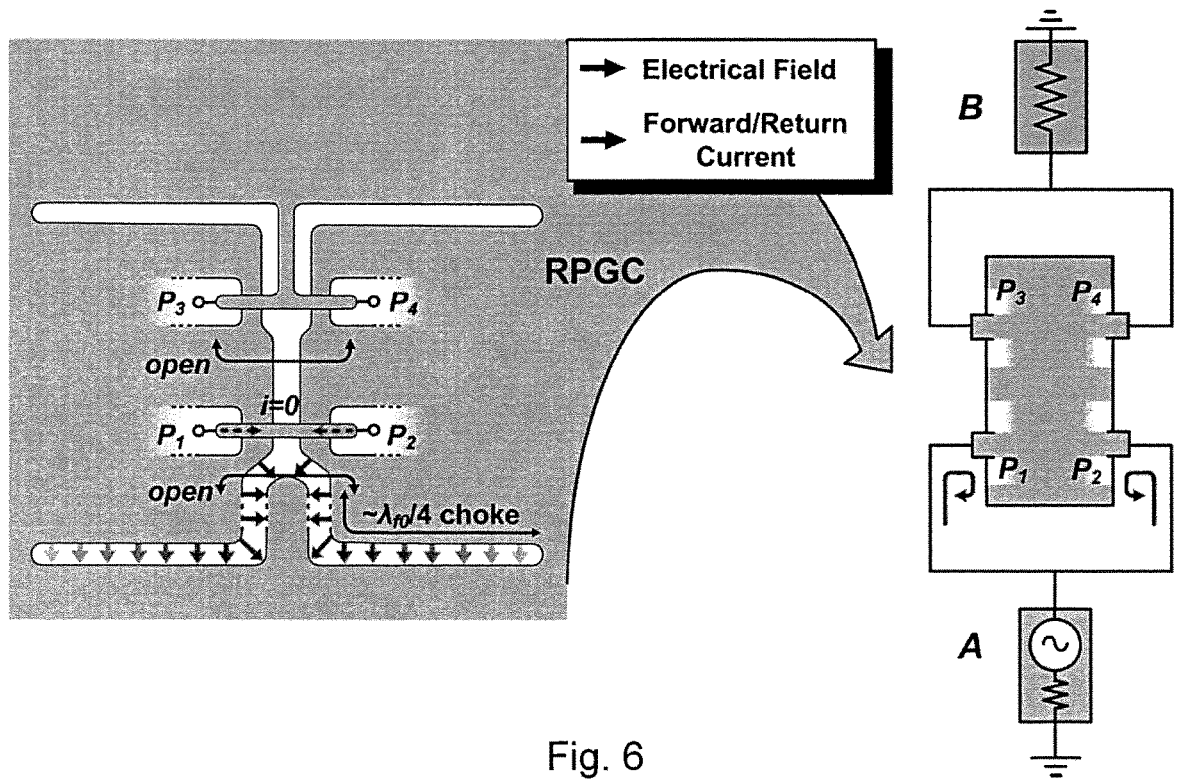
Fig. 6

Oscillation power at $f_0$:

$$P_{osc} = -\text{Re}(V_1 I_1^*) - \text{Re}(V_2 I_2^*)$$

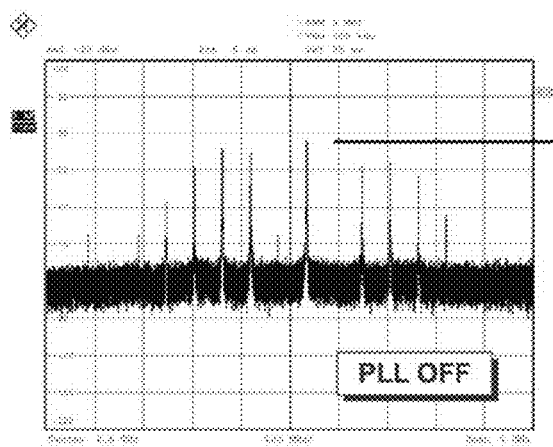
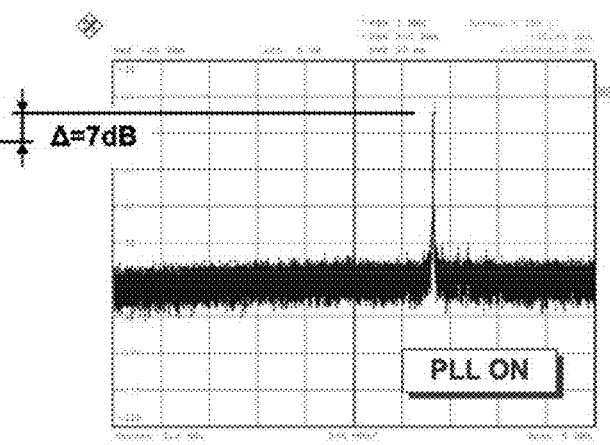
Fig. 31A          Fig. 31B
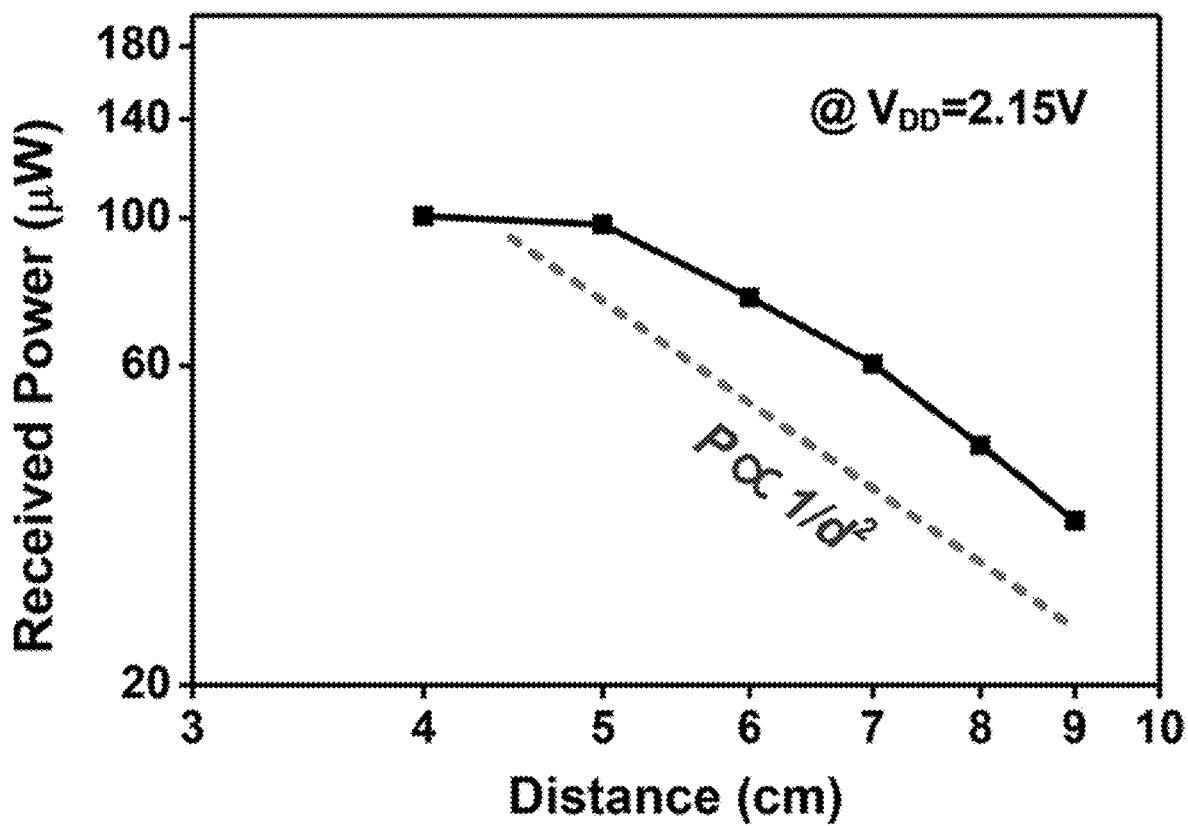
Fig. 32

| References | Technology ($f_{max}$) | Frequency (GHz) | Total Radiated Power (mW) | EIRP (dBm) | Phase Noise @ 1 MHz (dBc/Hz) | DC Power (W) | DC-to-THz Radiation Efficiency (%) | Area (mm²) | Phase Locked? | Note |
|---|---|---|---|---|---|---|---|---|---|---|
| J. Gryzb et al. (2013) | 65-nm CMOS (190 GHz) | 288 | 0.4 | N/A | -87 | 0.28 | 0.14 | 0.29 | No | Silicon Lens |
| Y. Tousi et al. (2014) | 65-nm CMOS (250 GHz) | 338 | 0.8 | 17.1 | -93 | 1.54 | 0.053 | 3.9 | | |
| R. Han et al. (2013) | 65-nm CMOS (250 GHz) | 260 | 1.1 | 15.7 | -78 | 0.8 | 0.14 | 2.3 | | Silicon Lens |
| K. Schmalz et al. (2013) | 130-nm SiGe (500 GHz) | 245 | 1.3 | ? | N/A | 0.38 | 0.33 | 3.2 | | Extra Wafer Thinning |
| U. Pfeiffer et al. (2014) | 130-nm SiGe (500 GHz) | 530 | 0.09 (Single Unit) / 1 (Incoherent Array) | 25 / N/A | N/A | 0.16 / 2.5 | 0.06 / 0.04 | 0.025 / 4.2 | | Silicon Lens / Extra Wafer Thinning |
| K. Sengupta et al. (2023) | 45-nm CMOS (190 GHz) | 280 | 0.2 | 9.4 | N/A | 0.82 | 0.023 | 7.2 | | |
| P. Y. Chiang et al. (2014) | 90-nm SiGe (315 GHz) | 295 | 0.04 (Probed Power) | N/A | -82.5 | 0.38 | N/A | 2.6 | | Non-Radiating |
| Present Disclosure | 130-nm SiGe (280 GHz) | 317 | 1.2 / 3.3 | 13.9 / 22.5 | -79 | 0.61 | 0.2 / 0.54 | 2.1 | Yes | Silicon Lens |

Fig. 35

DEVICE FOR TERAHERTZ SIGNAL GENERATION AND TRANSMITTER

CROSS-REFERENCE TO RELATED APPLICATIONS

This application is a National Phase of International Application No. PCT/US2016/018991, filed on Feb. 22, 2016, which claims priority to U.S. Provisional Application No. 62/119,100, filed on Feb. 20, 2016, the disclosures of which are incorporated herein by reference.

STATEMENT REGARDING FEDERALLY SPONSORED RESEARCH OR DEVELOPMENT

This invention was made with government support under grant number 0954537 awarded by the National Science Foundation and grant number N00014-12-1-0072 awarded by the Office of Naval Research. The government has certain rights in the invention.

FIELD OF THE DISCLOSURE

The present disclosure relates to THz signal generation and transmission.

BACKGROUND OF THE DISCLOSURE

Electromagnetic radiation in the terahertz range have demonstrated great potential in the imaging applications for biomedicine, security, and industrial quality control, due to its high spatial resolution (compared to millimeter wave) and non-ionizing natures (compared to X-ray). At present, the barrier to the wide application of this emerging sensing technology is mainly due to the difficulty of the high-power signal generation. Conventional THz sources include quantum-cascade lasers ("QCL"), photoconductive emitters, vacuum electronics, and III-V Schottky diode multiplier chains. However, these solutions have significant drawbacks, such as the high cost, large form factor, and stringent operation conditions (e.g., cryogenic cooling for QCL). Because of these, active THz imaging microsystems using integrated circuit technology are drawing increasing attention. In particular, imagers based on CMOS and BiCMOS processes are expected to not only resolve the above problems, but also achieve a high systematic integration level and high yield. This enables portable THz imaging equipment with a low cost.

However, there are several challenges towards this goal. First, the radiated power of existing THz transmitters is still insufficient. This is mainly due to the limited speed and breakdown voltage of the silicon transistors. The first THz CMOS radiator source reported in 2008 only generated 20 nW power at 410 GHz. Since then, significant progress has been made with synergistic efforts in device, circuit, and electromagnetism. A 390 µW power was previously obtained in the 288 GHz radiator based on a triple-push oscillator topology. A known 338 GHz phased array achieved 810 µW power. A known self-feeding oscillator array generated 1.1 mW radiated power at 260 GHz. Besides this work in CMOS, radiation sources in BiCMOS processes also demonstrate great potential, thanks to the superior speed and breakdown voltage of the SiGe heterojunction bipolar transistor ("HBT"). For example, radiators using a 130 nm SiGe BiCMOS process ($f_{max}$=500 GHz, $V_{CEO}$=1.6 V) achieve 1.3 mW of power at 245 GHz and 74 µW (single element)/1 mW (incoherent array) of power at 530 GHz. To some extent, larger total radiated power can be obtained through the combination of an increased number of array elements. By comparison, the DC to THz radiation efficiency is more relevant to the performance of the devices and basic circuit blocks. It is particularly important for energy and thermal limited portable systems. Within less than a decade, the DC to THz radiation efficiency of silicon sources has increased by over 1000×. However, due to the approach of harmonic generation, the absolute efficiency level is still low. Previously reported highest DC to THz radiation efficiencies are 0.14% in CMOS and 0.33% in SiGe BiCMOS.

The challenge of the on-chip active THz imaging system also resides in the receiver side. Due to the lack of power amplification for THz signals ($f_{in}$>$f_{max}$), focal-plane arrays in silicon rely on the direct passive detection using nonlinear devices, such as Schottky diode and MOSFET. This leads to limited sensitivity and further requires high-power generation from the transmitter. On the other hand, due to the Rayleigh diffraction limit and the usage of resonant antenna coupling, the size of an imaging pixel at THz, especially at low-THz (~300 GHz) is large. It is therefore difficult to accommodate a large number of pixels on a single silicon die. Therefore, mechanical scanning is commonly used, which unfortunately prohibits the miniaturization of the imager and leads to long imaging time. To solve this issue, capability of electronic beam scanning is highly desired.

Non-ionizing terahertz imaging using solid-state integrated electronics has been gaining increasing attention over the past few years. However, there are currently several factors that deter the implementations of fully-integrated imaging systems. Due to the lack of low-noise amplification above $f_{max}$, the sensitivity of THz pixels on silicon cannot match that of its millimeter-wave or light-wave counterparts. This, combined with the focal-plane array configuration adopted by previous sensors, requires exceedingly large power for the illumination sources. Previous works on silicon have demonstrated 1 mW radiation; but higher power, as well as energy efficiency, are needed for a practical imaging system. In addition, a heterodyne imaging scheme was demonstrated to be very effective in enhancing detection sensitivity. Due to the preservation of phase information, it also enables digital beam forming with a small number of receiver units. This however requires phase locking between the THz source and receiver LO with a small frequency offset (IF<1 GHz). Although a 300 GHz PLL was reported with 40 µW probed power, on-chip phase locking of high-power THz radiation remains very challenging.

Generally, to maximize the harmonic ($2f_0$) output power inside a radiating oscillator, it is advantageous to (i) achieve the optimum voltage gain of the transistor at $f_0$ to maximize the oscillation activity, (ii) isolate the base and collector at the harmonic to eliminate the self-power-cancellation/loading effects, (iii) decouple the base and collector at DC for optimum biasing, and (iv) efficiently radiate the harmonic signal without long, lossy feed lines (used for resonance at $f_0$ in previous works). Unfortunately, none of the previous topologies can simultaneously meet these conditions.

BRIEF SUMMARY OF THE DISCLOSURE

A high-power 320 GHz transmitter is disclosed and characterized herein. Using a 130 nm SiGe:C BiCMOS process ($f_T$/$f_{max}$=220/280 GHz, $BV_{ceo}$=1.6 V), this transmitter achieves a record total radiated power of 3.3 mW and DC to THz radiation efficiency of 0.54%. It also has a fully-integrated phase locking capability. Although a 300 GHz phased-locked loop (PLL) with a probed output power of 40 μW is known, the presently-disclosed apparatus is the first demonstration of phase locking in a high-power THz radiating source. Also provided herein is a THz radiator structure based on a return-path gap coupler, which enables the high-power generation of the disclosed transmitter.

DESCRIPTION OF THE DRAWINGS

For a fuller understanding of the nature and objects of the disclosure, reference should be made to the following detailed description taken in conjunction with the accompanying drawings, in which:

FIG. 5A depicts a typical push-push oscillator showing differential standing-wave oscillation inside the near quarter-wavelength-long resonator;

FIG. 5B depicts the push-push oscillator of FIG. 6A showing common-mode $2^{nd}$-harmonic signal extraction in the form of traveling wave with internal multi reflections;

FIG. 6 depicts operation and field/current distribution of a return patch gap coupler ("RPGC") structure according to an embodiment of the present disclosure in the in-phase excitation mode;

FIG. 31A shows the measured, down-converted spectrum of the transmitter radiation when the on-chip PLL is OFF;

FIG. 31B shows the measured, down-converted spectrum of the transmitter radiation when the on-chip PLL is ON;

FIG. 32 shows the received radiated power of the power meter at varying distances, d, from the exemplary 320 GHz transmitter chip;

FIG. 35 is a table comparing the performance of terahertz sources in Silicon.

DETAILED DESCRIPTION OF THE DISCLOSURE

Figure 1:
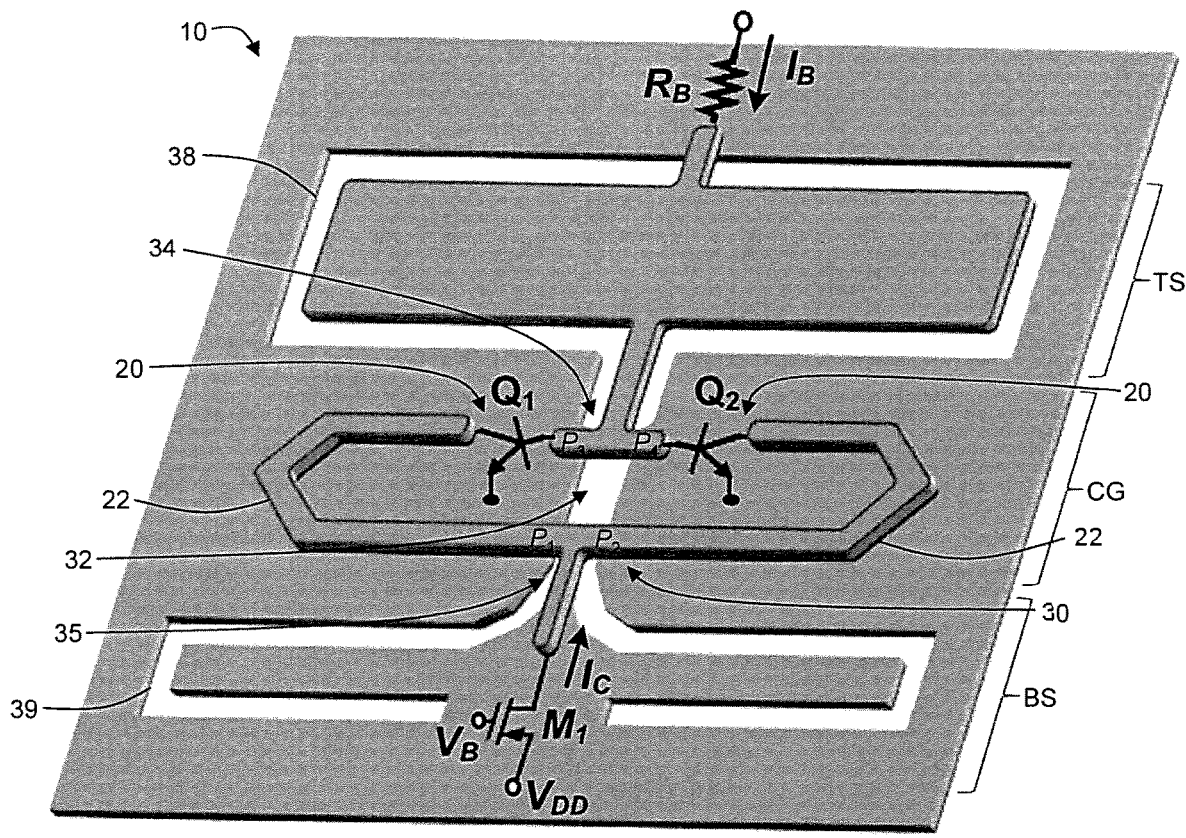
FIG. 1 is a schematic of a THz radiator according to an embodiment of the present disclosure, where $M_1$ is W/L=200 μm/0.13 μm, $Q_1$ and $Q_2$ are $L_e$=4.5×2 μm, 2×(CBEB)-C, and $R_B$ is 4 kΩ.

With reference to FIG. 1, the present disclosure may be embodied as a terahertz radiator 10, comprising two oscillators 20 operating at a fundamental frequency ($f_0$). The fundamental frequency may be, for example, between 100 GHz and 200 GHz, inclusive, including all ranges and integer values therebetween. In a particular non-limiting example used through this paper, the fundamental frequency is 160 GHz. Each oscillator 20 has a feedback path 22. The feedback path 22 of each oscillator 20 may comprise a transmission line. The oscillators 20 are configured to provide differential coupling at $f_0$ and harmonic extraction at a harmonic of $f_0$ (the radiating frequency). In an exemplary embodiment, the radiating frequency is the second harmonic ($2f_0$), for example, 320 GHz.

Figure 4:
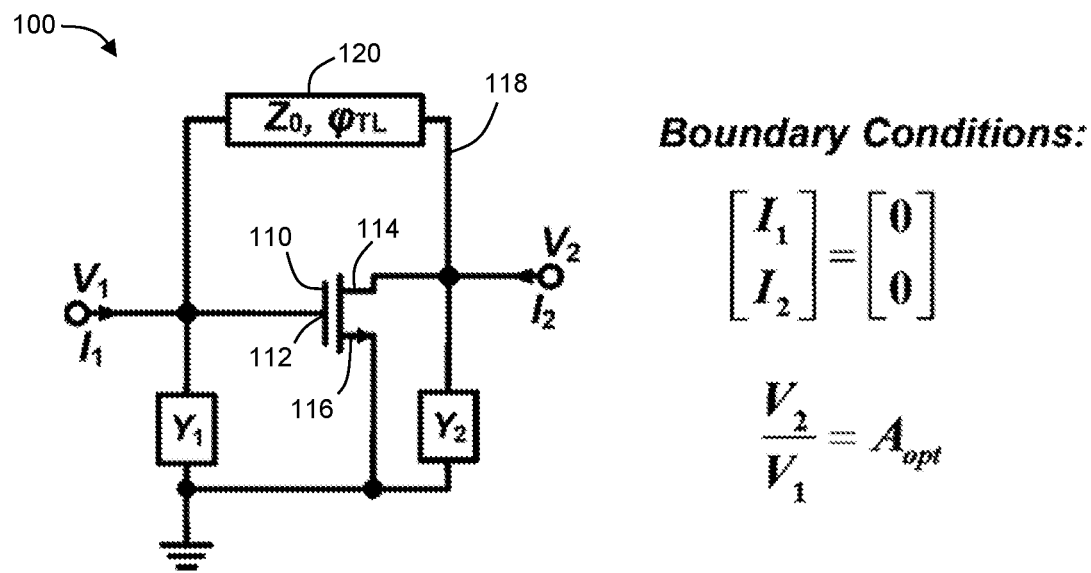
FIG. 4 is a simplified schematic of a self-feeding oscillator suitable for use with the presently-disclosed radiator (the boundary conditions shown in the figure are for a self-sustaining oscillator with optimum transistor voltage gain and lead to the relation derived in equation (1) of the text)

In an embodiment, each oscillator 100 is a self-feeding oscillator comprising a heterojunction bipolar transistor 110 (HBT) having a base 112, a collector 114, and an emitter 116 (see, e.g., FIG. 4). The base 112 is in electrical communication with the collector 114, thereby forming a feedback path 118. The feedback path 118 may comprise a transmission line 120, having a characteristic impedance ($Z_0$) and an electrical length ($\varphi_{TL}$).

Referring back to FIG. 1, a coupler 30 is disposed in the feedback paths of the oscillators 20. The coupler 30 is configured to be transparent to a signal at $f_0$, and blocking to a signal at a harmonic of $f_0$, such as, for example, $2f_0$. In an embodiment, the coupler 30 comprises two pairs of input/output ports, $P_1$-$P_2$ and $P_3$-$P_4$. Each pair of ports has a first port $P_1$, $P_3$, and a second port $P_2$, $P_4$, respectively. A first signal path connects the corresponding first ports $P_1$, $P_3$, and a second signal path connects the corresponding second ports $P_2$, $P_4$. A gap 32 is disposed in a first return path (between $P_1$ and $P_3$, corresponding to the first signal path) and a second return path (between $P_2$ and $P_4$, corresponding to the second signal path).

The radiator 10 may further comprise a first choke 38 at a radiating end 34 of the coupler 30. The first choke 38 is configured as a quarter-wave choke at $f_0$, and as a slot antenna at the radiating frequency of the radiator 10. For example, the first choke 38 may be a slot antenna tuned for $2f_0$. The radiator 10 may further comprise a second choke 39 at a second end 35 of the coupler 30. The second choke 39 is configured as a quarter-wave choke at $f_0$.

In another aspect of the present disclosure, a terahertz transmitter 200 comprises an array 205 of radiators 210. The radiators 210 are of any configuration disclosed herein. The array 205 comprises at least one row 207 of radiators 210. In the exemplary embodiment depicted in FIG. 23, the transmitter 200 comprises an array 205 of sixteen radiators 210 arranged in four rows 207, with four radiators 210 in each row. The radiators 210 are mutually coupled to adjacent radiators 210 within the respective row. The mutual coupling is formed by connection 209 of a feedback path 222 of a radiator 210 with an adjacent feedback path 222 of an adjacent radiator 210 (see FIGS. 24A and 24B).

The transmitter 200 further comprises a phase-locked loop 250 ("PLL") with at least one voltage-controlled oscillator ("VCO") 252 (the number of VCOs corresponding to the number of rows of the array). The at least one VCO 252 is configured to operate at a VCO frequency. In embodiments having multiple VCOs 252, the VCOs 252 are mutually coupled to one another such as to operate at the same frequency. Reference is made in this description to the multiple VCOs 252 of FIG. 23 for convenience. Each VCO 252 is in electrical communication with a radiator 210 of the corresponding row 207. As such, each VCO 252 is configured to injection lock the radiators 210 of the corresponding row at a VCO frequency or a harmonic of the VCO frequency.

The characteristics of the VCOs are generally selected to operate the radiators at a desired radiating frequency for the transmitter. For example, where a terahertz transmitter is desired to operate at 320 GHz, the radiators may be configured to radiate at a second harmonic of a fundamental frequency of 160 GHz, and the radiators may be injection-locked by VCOs at a second harmonic of a VCO frequency of 80 GHz. Other configurations will be apparent in light of the present disclosure.

Further Discussion

The presently-disclosed devices are further described with reference to an exemplary high-power 320 GHz transmitter. Using a 130 nm SiGe:C BiCMOS process ($f_T$/$f_{max}$=220/280 GHz, $BV_{ceo}$=1.6 V), this transmitter achieves a record total radiated power of 3.3 mW and DC to THz radiation efficiency of 0.54%. It also has a fully-integrated phase locking capability. The high-power generation of this of the disclosed transmitter is based on the presently disclosed THz radiator structure utilizing a return-path gap coupler.

Radiator Design for High-Power and Energy-Efficient THz Generation

There are generally two approaches for generating THz signals in silicon: harmonic oscillators and frequency multipliers. While both approaches utilize the nonlinear harmonic generation of the devices, harmonic oscillators, which are self-sustaining, do not require external RF input, and are therefore normally more energy efficient. Although harmonic oscillators have a smaller output tuning bandwidth as compared to frequency multipliers, such issue is not critical for two-dimensional THz imaging. Therefore, the disclosed THz radiator is based on a harmonic oscillator.

The disclosed radiator design follows a bottom-up, device-centric methodology. Terahertz circuits operate close to the activity-inactivity boundary of transistors; the performance is therefore sensitive to the device efficacy. We show in this section that, in the presently-disclosed design, instead of inserting devices into conventional circuit topologies, the optimum conditions of a single SiGe HBT were first analyzed. Then, an electromagnetic wave structure, called return-path gap coupler, was designed to achieve these conditions for the highest harmonic generation out of the HBT. In particular, this single structure can simultaneously perform fundamental oscillation, harmonic generation, and on-chip radiation, hence minimizing the radiator loss and footprint.

Optimum Conditions for Harmonic Generation at THz

To maximize the harmonic output power from a radiating oscillator, the first step is to maximize the oscillation activity of the transistor at the fundamental frequency, $f_0$. An optimum complex voltage gain of a two-port active network ($A_{opt}=v_c/v_b$ for a SiGe HBT) that maximizes the net power generated from the device was previously derived. In particular, it was found that an extra phase shift beyond the conventional 180° inversion behavior of the transistor is beneficial. This is mainly due to the pico-second intrinsic delay of the devices, as well as the capacitive feedforward path between the two terminals (e.g., $C_\mu$ between the base and collector of an HBT). As one example, for a 130 nm SiGe HBT with a total emitter length of 4.5×2 µm and a collector current of 7 mA, the simulated optimum phase of the base-to-collector complex voltage gain is plotted in FIGS. 17 and 21. It can be seen that at 160 GHz an extra phase shift of 89° is required. Unfortunately, conventional push-push oscillators do not meet such optimum conditions, and therefore lead to smaller oscillation power. Triple-push topology can achieve the optimum phase, but the $3^{rd}$-order harmonic generation is normally less efficient than the $2^{nd}$-order harmonic generation. Meanwhile, due to the ring topology, it is difficult to connect the oscillator output to an on-chip antenna, which is big in size (~λ/2). A self-feeding oscillator design is used to solve this problem. The basic schematic of the oscillator is shown in FIG. 4, where the oscillation feedback path is formed via a transmission line. The transistor and reactive components $Y_1$ and $Y_2$ are considered as the active and passive boundary conditions for the wave propagation inside the line. When the characteristic impedance, $Z_0$, and the electrical length, $\varphi_{TL}$, of the self-feeding transmission line meet the following condition:

$$Z_0 \sin \varphi_{TL} = \frac{A_{opt,I}}{g_{11} + \text{Re}(A_{opt} \cdot y_{12})} \quad (1)$$

the optimum gain $A_{opt}$ of the device is achieved. In (1), $A_{opt,I}$ is the imaginary part of $A_{opt}$.

Secondly, for harmonic-signal generation, it is found that load impedance matching alone is not sufficient to fully optimize the generation efficiency. In specific, harmonic-frequency isolation between the two terminals of a transistor is required, in order to avoid the self-power loading/cancellation effect. It is noteworthy that such harmonic isolation is not realized in conventional push-push oscillator or triple-push oscillator. The CMOS self-feeding oscillator achieves acceptable isolation by using a quarter-wavelength ($\varphi_{TL}=\sim 90°$ at $2f_0$, or ~45° at $f_0$) self-feeding line to transform the low gate impedance into a high impedance; the harmonic signal generated at the drain node is therefore blocked from the gate. This solution, however, has some limitations: (i) according to (1), the values of $Z_0$ and $\varphi_{TL}$ are coupled. But, the $\varphi_{TL}$ of ~45° may result in a $Z_0$ that is too low or too high, depending on the particular devices; (ii) for SiGe HBT, the harmonic generation is most effective at the base junction of the device. The above quarter-wavelength impedance transformation approach is therefore not feasible. So a new, more general harmonic signal isolation method is needed.

Finally, in oscillators based on multi-push structure, it is common to use transmission lines or inductors to form resonance tank for the fundamental oscillation at $f_0$. At the end of the tank, where the multi-phase fundamental signals cancel, harmonic power is combined from these branches. Such configuration, however, introduces significant loss to the harmonic signal. Shown in FIGS. 5A and 5B, the $2^{nd}$-harmonic signal generated from the HBT needs to travel along the entire transmission line before it reaches the output antenna. Since at $f_0$, standing-wave oscillation is formed (FIG. 5A), the length of the transmission line is close to a quarter wavelength $\lambda_{f_0}/4$. This means at $2f_0$, the length of the line is near half wavelength $\lambda_{2f_0}/2$. More importantly, since impedance matching is only done at the output, significant multiple reflections normally occur inside the line (FIG. 5B). This further increases the ohmic loss for the harmonic signal. Due to this reason, it is highly desired that the harmonic-signal radiation can occur right beside the devices. Although a previous distributed active radiator ("DAR") structure is known to have met this requirement, it does not achieve the optimum conditions for fundamental oscillation and harmonic generation due to the usage of cross-coupled pair similar to the push-push oscillator.

In summary, to generate the maximum THz radiation, it is advantageous to achieve (i) optimum complex voltage gain of the transistor at $f_0$, (ii) harmonic isolation between the two terminals of the transistor at $nf_0$ (assume $n^{th}$-harmonic signal is the output), and (iii) instant harmonic-signal radiation near the transistor. No prior THz radiator design can simultaneously achieve these three conditions.

High Power THz Radiator Design Based on a Return Path Gap Coupler

To address the above issues, a new second-harmonic ($2f_0$) THz radiator is disclosed herein. It is built on a differential self-feeding oscillator structure, so that the fundamental ($f_0$) oscillation power is maximized. Meanwhile, to achieve the harmonic-signal isolation (thus optimum harmonic generation efficiency), a signal filter is utilized on the oscillator feedback path: it should be transparent to the oscillation signal at $f_0$, but opaque to the generated signal at $2f_0$. Although this matches the operation of a low-pass filter ("LPF"), it is noteworthy that frequency filtering in THz range is not only lossy, but also occupies large area. In addition, according to (1), the significant phase shift introduced by the LPF at $f_0$ may either reduce the oscillation frequency, or lead to a value of $Z_0$ that is too small to implement.

Figure 2A:
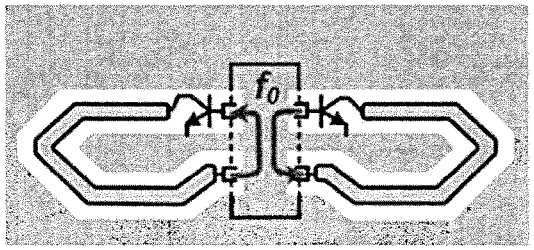
FIG. 2A depicts summarized operation pf the radiator of FIG. 1 for fundamental oscillation.
Figure 2B:
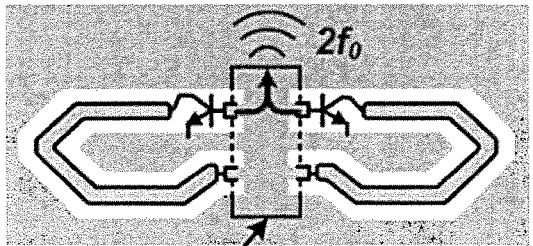
FIG. 2B depicts summarized operation of the radiator of FIG. 1 for $2^{nd}$ harmonic radiation. Please note that the structure is not drawn to scale.
Figure 3:
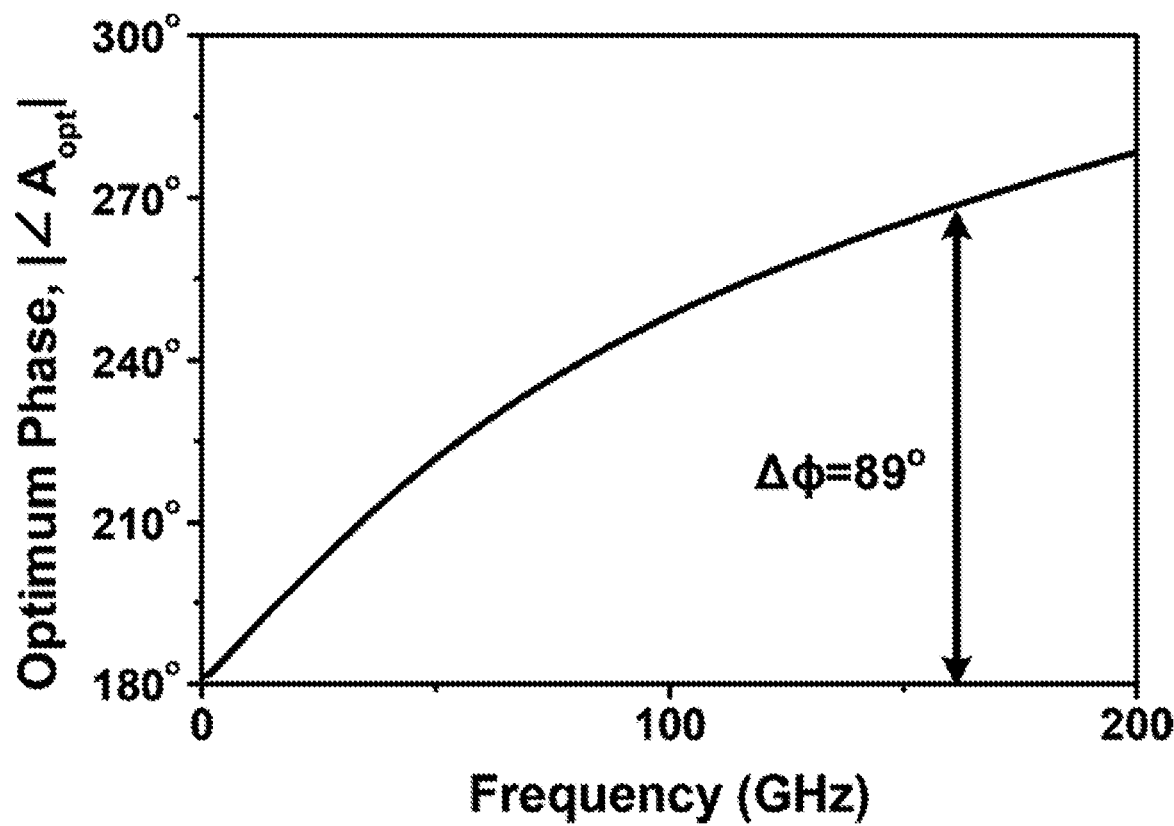
FIG. 3 depicts the simulated optimum phase of the complex voltage gain for a 130 nm SiGe HBT ($L_e$=4.5×2 μm) (the phase of $A_{opt}$ is negative, representing the physical delay from the input to the output of a transistor)

Instead of filtering the signals based on their frequencies, the presently-disclosed radiator design utilizes the orthogonality of different wave modes. By implementing a return-path gap coupler (RPGC) inside the self-feeding oscillator (FIGS. 2A and 2B), the proposed radiator simultaneously achieves optimum fundamental oscillation, harmonic-signal generation and on-chip radiation. The structure of the radiator is shown in FIG. 1. The transmission lines connecting the transistors are based on the grounded coplanar waveguide (GCPW, the grounded side walls are not shown for the simplicity of the illustration). The signal trace uses the top copper layer (3 µm thick), and the bottom ground uses overlapped M1-to-M3 layers for better ground conductivity and DRC compliance. Next, to better describe the operations of the RPGC at $f_0$ and $2f_0$, the physical structure of the radiator may be considered as divided into three parts: top slots, central gap, and bottom slots (FIG. 1; labeled TS, CG, and BS, respectively).

Figure 11:
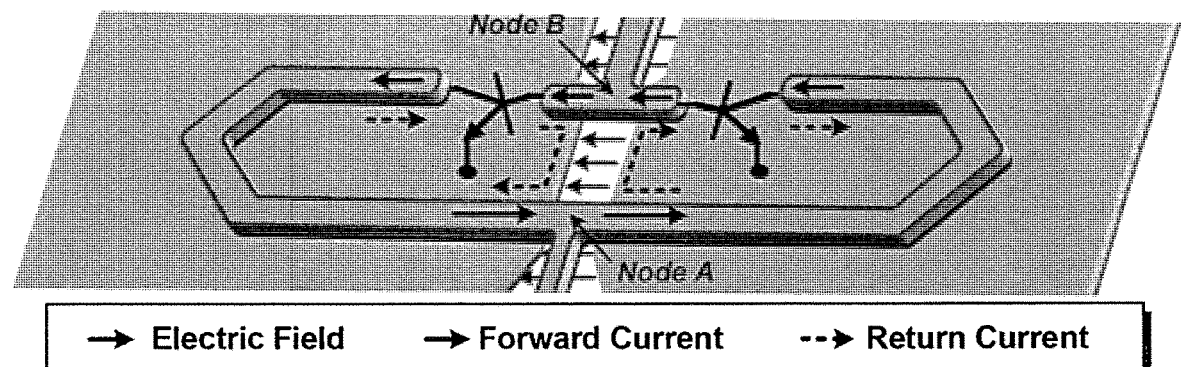
FIG. 11 depicts the current and electric-field distribution for the odd-mode oscillation at $f_0$ in the central gap.

By symmetry, the two transistors have both odd (out-of-phase) and even (in-phase) modes for the oscillation at $f_0$ (if oscillation can occur). For the odd-mode oscillation signal at $f_0$, the distributions of the electric field, forward current and return current are illustrated in FIG. 11. (Note that the directions of the solid blue arrows in FIG. 11 only illustrate the relative phase difference of the current, not the directions of the power flow. The power flow along the self-feeding lines and the RPGC is always from the collector to the base of the HBT.) When the differential signals generated from the HBT collectors meet after traveling along the GCPW lines, a virtual ground is formed at Node A. Meanwhile, the return currents of this signal pair, though encountering the gap in the ground plane, can continue traveling along the edges of the gap. Due to the differential phase, the return currents induce a transverse electric field inside the gap. The Poynting vector ($\vec{S}=\vec{E}\times\vec{H}$) of the TEM wave inside the gap carries the oscillation power towards the base side. At Node B of the base GCPW lines, once again a virtual ground is formed, where forward currents are induced by the incident return-current pair. This can be interpreted as the reverse process of what occurs at Node A, due to the reciprocity of the similar metal structures. Therefore, the RPGC supports the propagation of odd-mode signal, and the oscillation of the radiator at $f_0$ is similar to a normal self-feeding oscillator pair. Note that the structures in the figures are not necessarily drawn to scale. The actual physical length of an exemplary return-path gap is only ~17 μm, so that the extra phase delay added to the self-feeding path is minimized (but not negligible). More discussion on this topic is provided below.

For the odd-mode operation, the role of the top and bottom slots is twofold:

They confine the self-feeding traveling wave within the central gap of the RPGC. The length of the top slots of the RPGC is quarter wavelength at $f_0$ (shown in FIG. 7), which transforms the short termination at Node C (virtual ground in the odd mode) to open at the edges of the RPGC central gap ($Z_{f_0 \cdot top} \to \infty$).

The impedances that the top and bottom slots of the RPGC present to the central gap are in shunt with the base-emitter junctions of the HBTs:

$$Y_1 = \left( \frac{Z_{f_0 \cdot top} // Z_{f_0 \cdot bottom}}{2} \right)^{-1}, \quad (2)$$

where $Y_1$ is the reactive termination needed in the self-feeding oscillator (FIG. 4). The bottom folded slots are slightly shorter than quarter wavelength in order to provide a weak inductance required by the calculated $Y_1$.

Overall, the four standing waves in the top and bottom slots of the RPGC block the leakage of the return-path currents traveling in the central metal gap. It is also noteworthy that these slots can be folded into the transverse direction, because this way the standing wave inside each folded half section is out-of-phase with the neighboring standing waves. This is advantageous to the elimination of the radiation from these standing waves, which causes loss to the oscillation signals at $f_0$.

Figure 13:
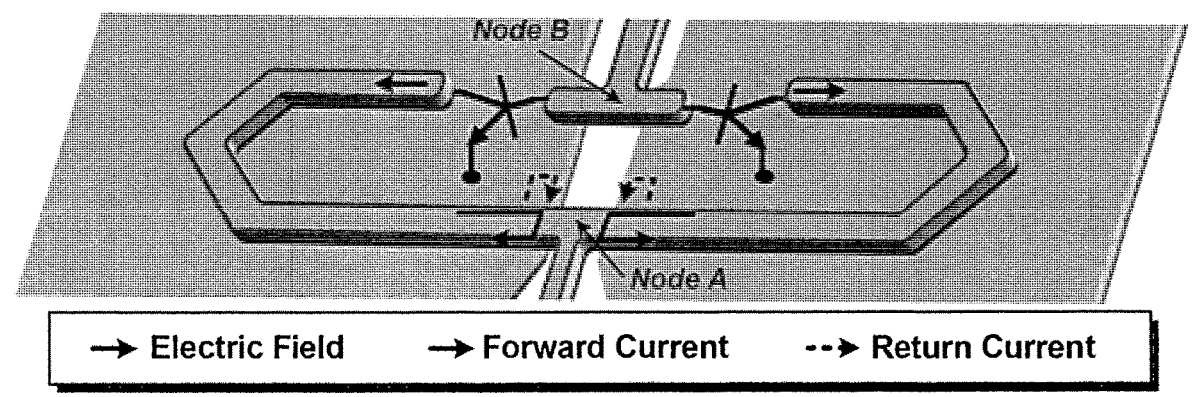
FIG. 13 depicts the current and electric-field distribution for the even-mode oscillation at $f_0$ in the central gap.

As mentioned previously, there is also an even (in-phase) oscillation mode of the HBTs. However, this undesired mode is not supported by the return-path gap. Shown in FIG. 13, when the even-mode signals meet at Node A, which presents an open, they are reflected back. Meanwhile, the even-mode return currents also cannot propagate along the edges of the return-path gap. In fact, such balanced wave is related to the TM mode of the metal gap. And, for such two-conductor waveguide, the cutoff frequency of the lowest TM mode is on the order of:

$$f_{c,TM} \sim \frac{1}{2d\sqrt{\mu\epsilon}}, \quad (3)$$

where d is the distance between the two edges of the gap, and μ and $\in$ are the permittivity and permeability of the dielectric inside and around the metal gap. In the instant design, the gap distance d is 12 μm and the relative dielectric constant is ~4, which result in a cutoff frequency of ~6 THz. Therefore, the even-mode signals at $f_0$ of 160 GHz are fully blocked by the return path gap. The feedback path is not formed and the even-mode oscillation does not occur.

Figure 12:
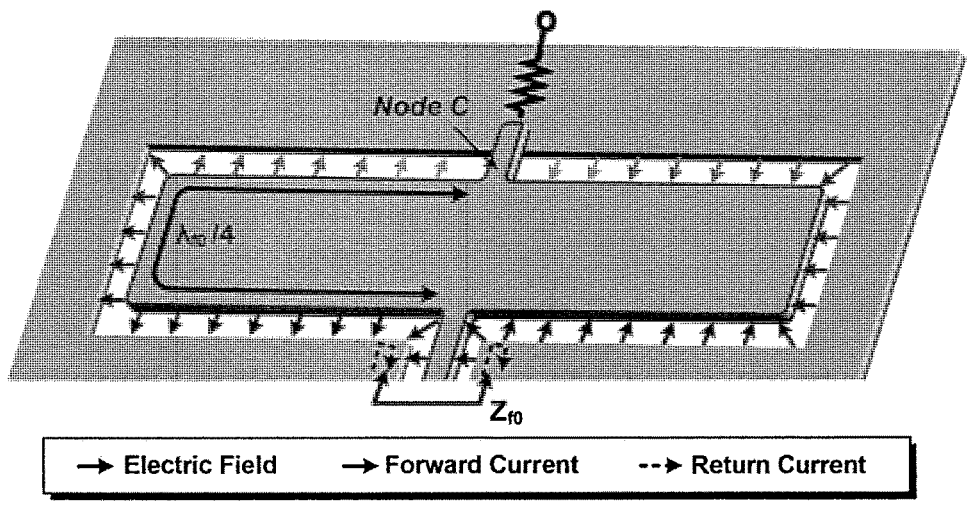
FIG. 12 depicts the standing-wave distribution for the odd-mode oscillation at $f_0$ in the top slots.
Figure 14:
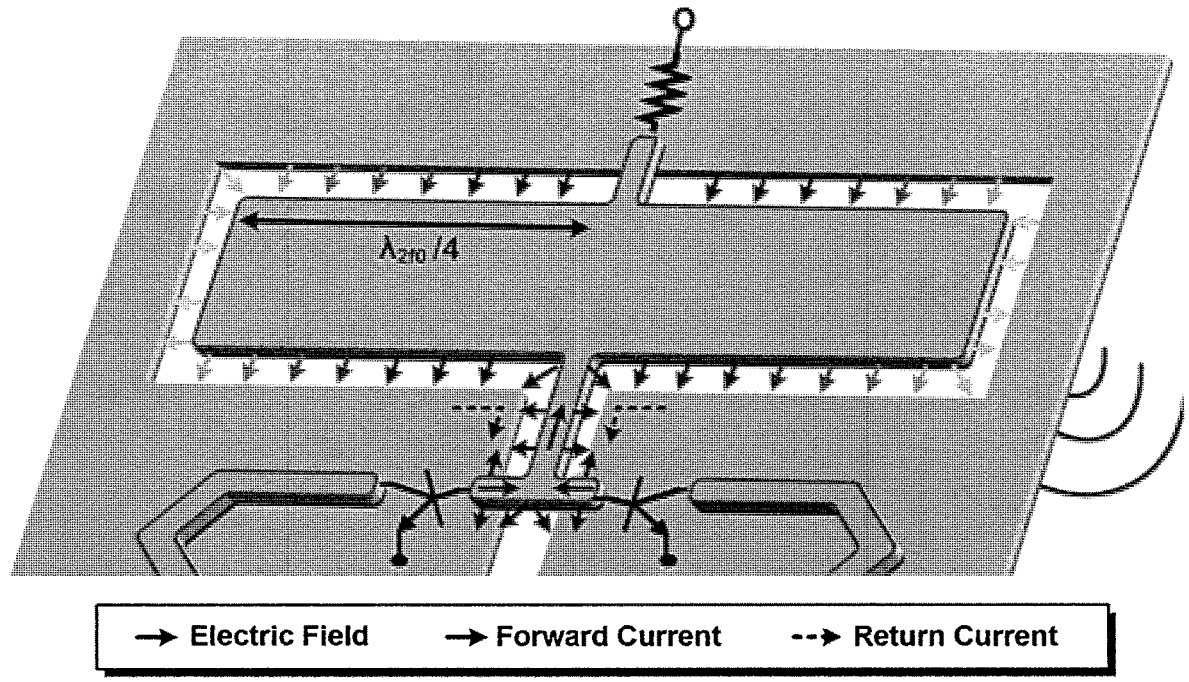
FIG. 14 depicts the standing-wave distribution for the even-mode harmonic signal at $f_0$ in the top slots.

Differential oscillation at $f_0$ leads to an even-mode $2^{nd}$-harmonic generation at the base junctions of the HBT pair. Therefore, the signal at $2f_0$ is also blocked by the RPGC. The full isolation between the base and collector of the HBTs increases the harmonic generation efficiency. On the other hand, as shown in FIG. 1, the common edge of the two top slots is connected to the bases of the HBTs, and the signal at $2f_0$ then creates standing-wave patterns as shown in FIG. 14. Note that the length of each slot at $f_0$ is quarter wavelength (FIG. 12). That means at $2f_0$, the length of each folded half slot is quarter wavelength. With such dimension, the top slots behave as a folded slot antenna, in which the four standing waves inside the half-slot sections are in-phase and efficiently radiate the $2^{nd}$-harmonic signal into the silicon substrate (and eventually coupled into the free space, as described below).

Lastly, it can be seen from FIG. 1 that the DC biases of the base and the collector of the transistors are naturally separated in the proposed RPGC-based radiator. Such separation, achieved without using any lossy AC coupling capacitor, is particularly important for SiGe HBTs due to the significant difference between the base and collector biases ($V_B \approx 0.8$ V, $V_C \approx 1.6$ V).

Simulation Results

Figure 16:
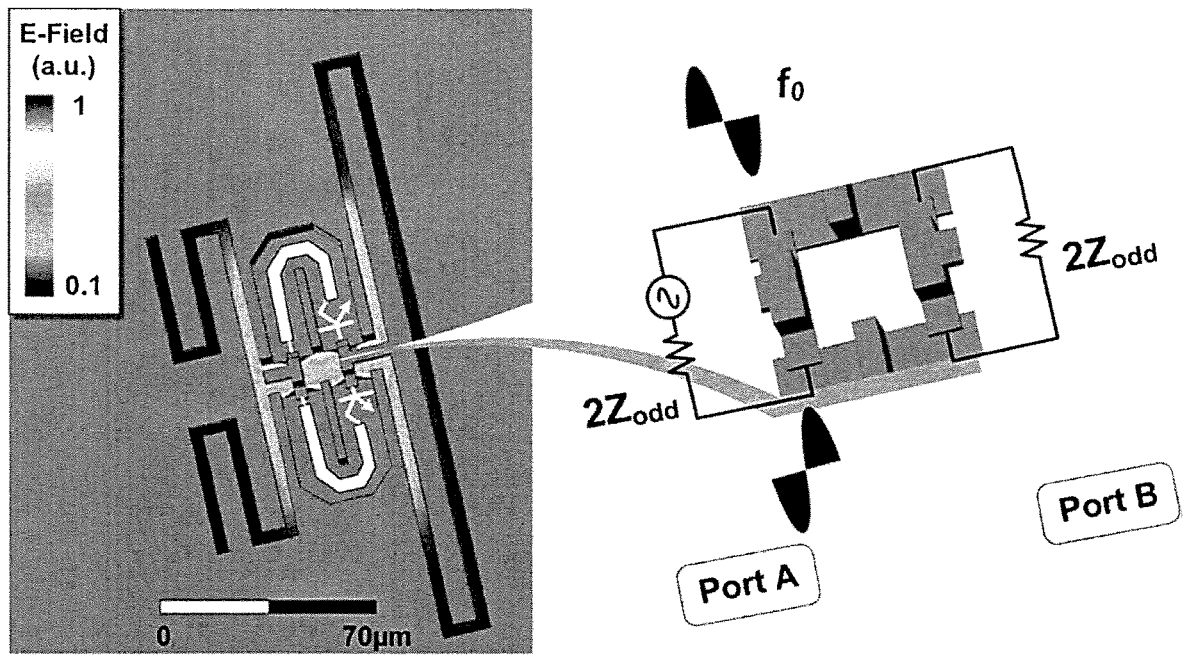
FIG. 16 depicts full-wave electromagnetic simulation of a THz radiator according to an embodiment of the present disclosure for odd-mode excitation/loading ports and the intensity distribution of the electric field.

The operations described above are verified by the full-wave electromagnetic simulations using HFSS. First, the return-path gap structure is stimulated by a differential (odd-mode) signal. The two-port simulation set up is shown in FIG. 16. FIG. 16 also presents the intensity distribution of the electric field inside the slots of the structure at the fundamental oscillation frequency of 160 GHz. It can be seen that the odd-mode signal is able to propagate along the return-path gap, and transfer from the differential Port 1 to Port 2. Meanwhile, standing waves are formed inside the four folded RF-choke slots. The results of the S-parameter simulation are plotted in FIG. 17. At 160 GHz, the insertion loss ($S_{21}$) of the structure is only 0.6 dB, which proves that the return-path gap is transparent to the differential oscillation signal.

Figure 18:
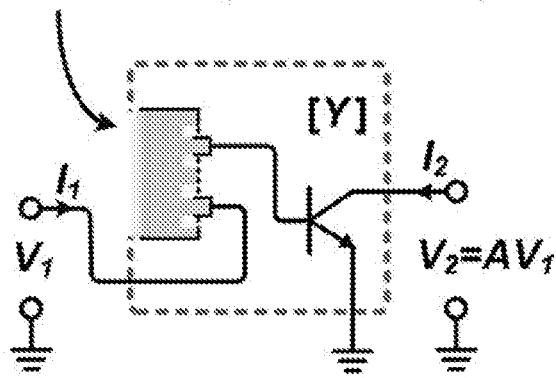
FIG. 18 depicts a two-port active network including a SiGe HBT and a series half-RPGC structure at the transistor base.
Figure 19:
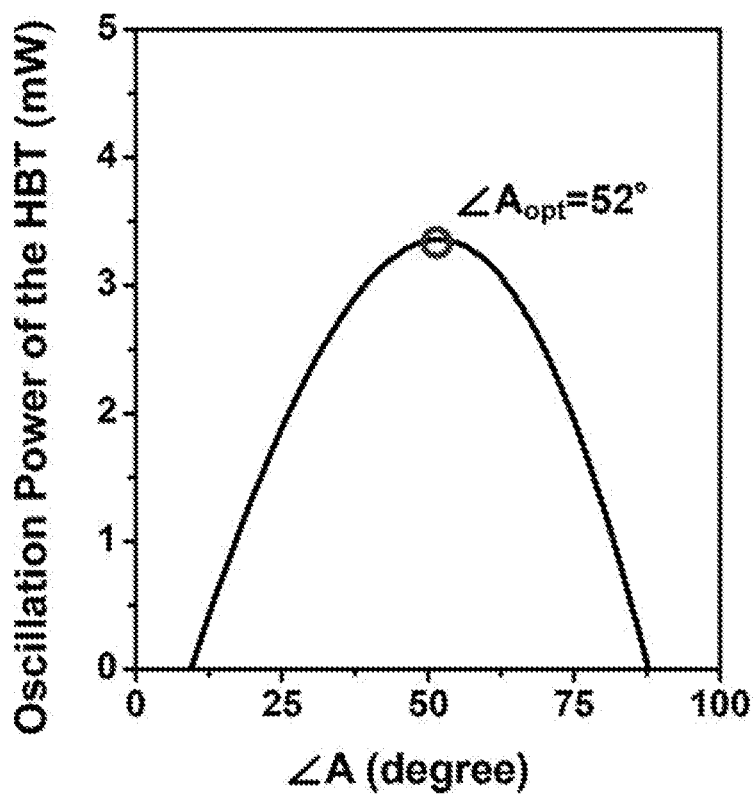
FIG. 19 shows a simulated optimum phase of the complex voltage gain of such active network at 160 GHz.

Although the RPGC inserted in series with the transmission lines of the self-feeding oscillator pair does not add much loss, the induced phase shift cannot be ignored. This means the values of $Z_0$ and $\varphi_{TL}$ in (1) are not only determined by the parameters of the HBT itself, but also by the RPGC. It is noteworthy that (1) is actually applicable to any two-port active network. Therefore, the HBT and one half of the RPGC (in odd-mode operation) can be considered to be a new equivalent "transistor" (FIG. 18). By simulating the Y-parameters of such combined network, we see that the optimum phase of the voltage gain is 52° (or −308°). The associated peak oscillation power is 3.4 mW. Based on these and (1), the self-feeding line in the final design has a characteristic impedance $Z_0$ of 55Ω and an electrical length $\varphi_{TL}$ of 35° at 160 GHz.

Figure 20:
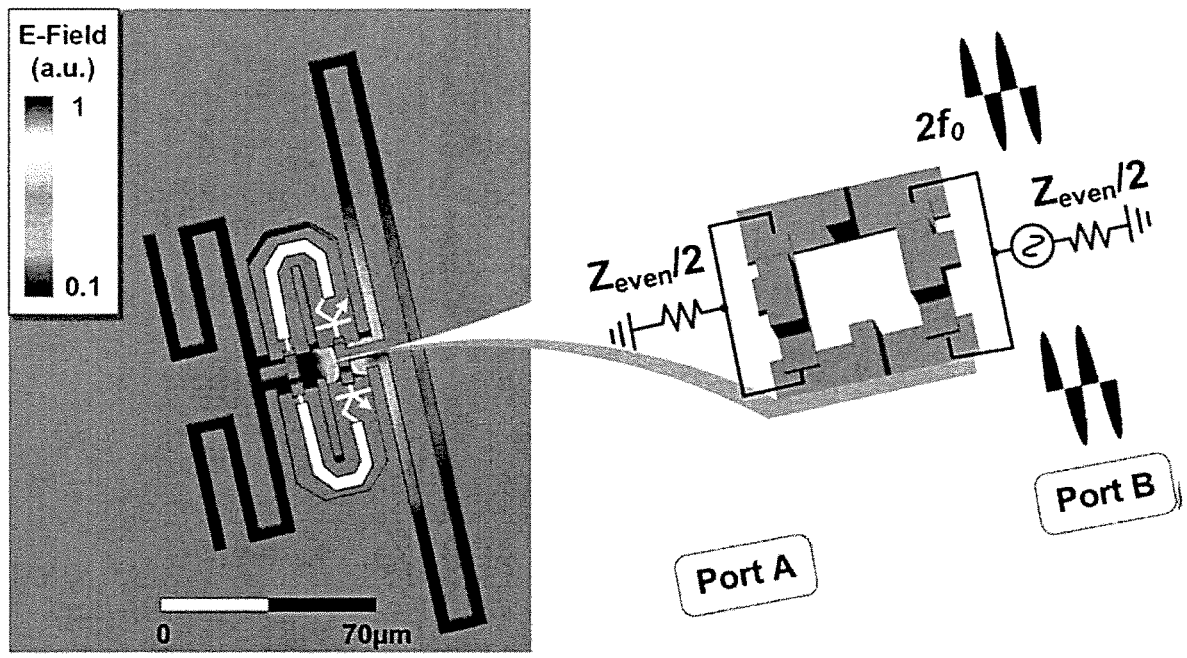
FIG. 20 depicts full-wave electromagnetic simulation of the THz radiator of FIG. 16 for even-mode excitation/loading ports and the intensity distribution of the electric field.
Figure 21:
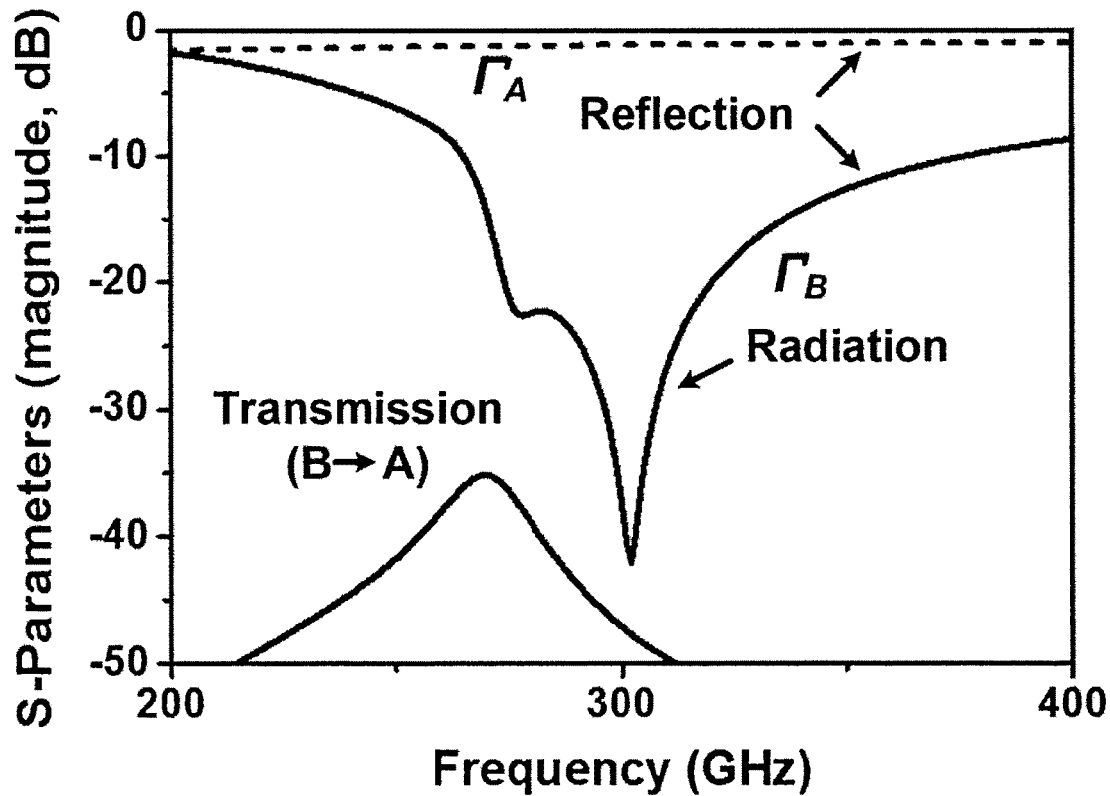
FIG. 21 depicts S-parameters near the $2^{nd}$-harmonic frequency of 320 GHz for the radiator of FIG. 20.
Figure 22:
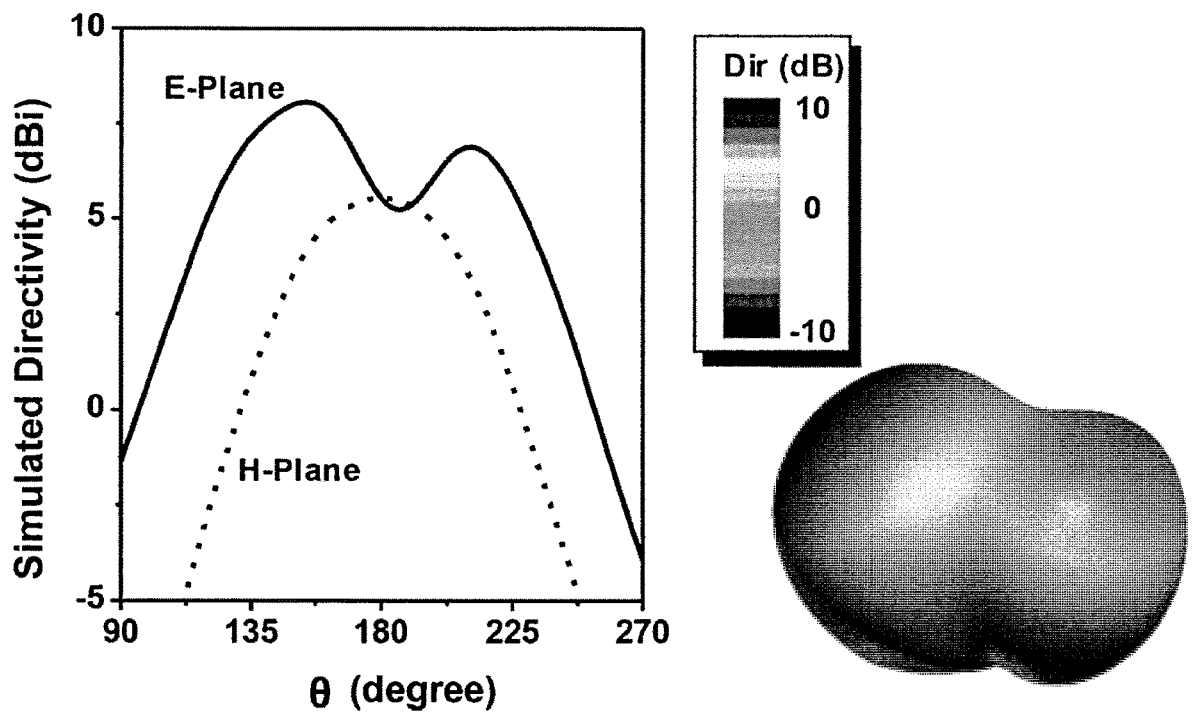
FIG. 22 shows a simulated radiation pattern of 320 GHz radiator unit according to an embodiment of the present disclosure and having a backside hemispheric silicon lens.

For the even-mode operation, the simulation setup is presented in FIG. 20. The stimulus from Port B represents the in-phase $2^{nd}$-harmonic signal generated at the two bases of the SiGe HBTs. At 320 GHz, the intensity distribution of the electric field inside the slots is shown in FIG. 20, too. It is evident that the injected signal is fully blocked by the return-path gap. Meanwhile, four standing waves inside the folded slots on the right are formed. As indicated in FIG. 21, the simulated isolation between the two sides of the return-path gap is better than −30 dB, meaning that the structure is opaque to the even-mode signal. Also, the small reflection coefficient at Port B ($\Gamma_B$) means that the $2^{nd}$-harmonic signal is fully absorbed by the structure. In fact, the signal is turned into a downward-propagating radiation wave inside the silicon; and the simulated radiation pattern is shown in FIG. 22. The directivity in the perpendicular direction is 5.6 dBi. To reduce the excitation of the substrate wave inside the silicon (250-μm thick), a backside hemispheric silicon lens is assumed in the simulation (modeled as a semi-infinite silicon boundary condition beneath the chip substrate). The simulated radiation efficiency, including ~30% power reflection at the silicon-to-air interface, is ~50%. The additional loss is due to the finite substrate resistivity (~10 Ω·cm). The simulated output power of each radiator is ~0.28 mW.

Figure 17:
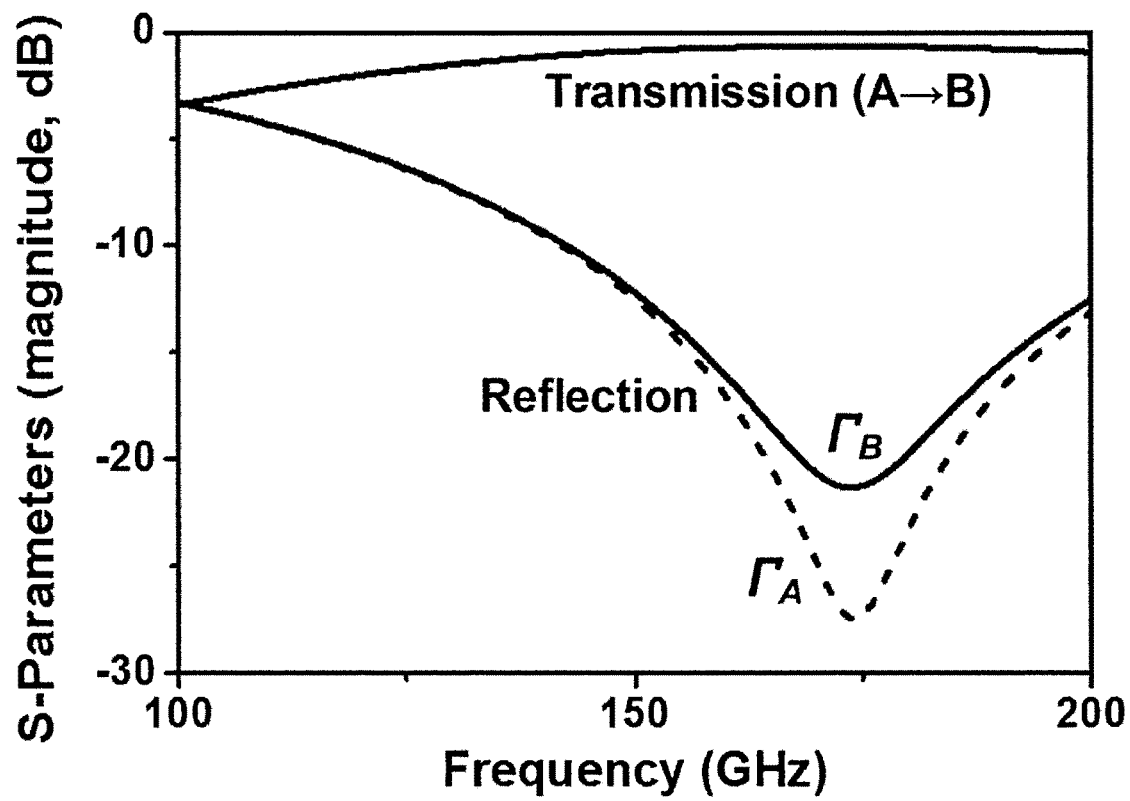
FIG. 17 depicts S-parameters near the fundamental oscillation frequency of 160 GHz for the radiator of FIG. 16.

Lastly, according to FIGS. 17 and 21, the orthogonal behaviors of the proposed structure for odd and even mode signals have a very broad bandwidth. This increases the robustness of the design with the presence of the process-voltage-temperature ("PVT") variations, and makes it suitable for future implementations of wide-tuning source and broadband data transmitter.

Signal mode filtering is an advantageous operation for signal processing circuits and systems. There are many occasions where it is desirable to preserve the differential component of the RF signal, while isolating/blocking the common-mode component. For example, operational amplifiers are designed to amplify only differential input signal, but the common-mode signal, usually from noise or interference, can also transfer to the output. Therefore, a signal coupler, that passes differential signal with a small loss, and at the same time attenuates the common-mode signal, is highly desirable. Such a signal coupler is also advantageous in the design of submillimeter-wave and THz circuits, because at such high frequencies, the loss of both active (e.g., transistor) and passive (e.g., transformer, balun) devices have significant loss and input-output leakage.

There are vast imaging, communication, and spectroscopy applications using the millimeter-wave and terahertz spectrum. To generate signals in this frequency range, harmonic oscillators is a useful solution. As previously described, the following two conditions are important for enhancing the harmonic output power of an oscillator:
  (i) optimum gate-to-drain gain for the transistor at $f_0$ to maximize the oscillation activity; and
  (ii) effective isolation of the gate and drain at harmonic to eliminate excessive lossy loading and self-power-cancellation effects.

While the self-feeding topology achieves these two conditions, it is still not suitable to oscillators using transistors like SiGe HBT, GaN HEMT, etc. because the gate and drain of such transistors have different operational voltage ranges and should be disconnected at DC. In addition, it is also desired that the oscillator have efficient harmonic-signal radiation capability itself. All above requirements are even more challenging considering the single metal layer (plus air bridge) normally provided in MMIC. To solve these, the present disclosure provides a new $2^{nd}$-harmonic oscillator structure based on a Return-Path Gap Coupler ("RPGC").

Return-Path Gap Coupler

Figure 8:
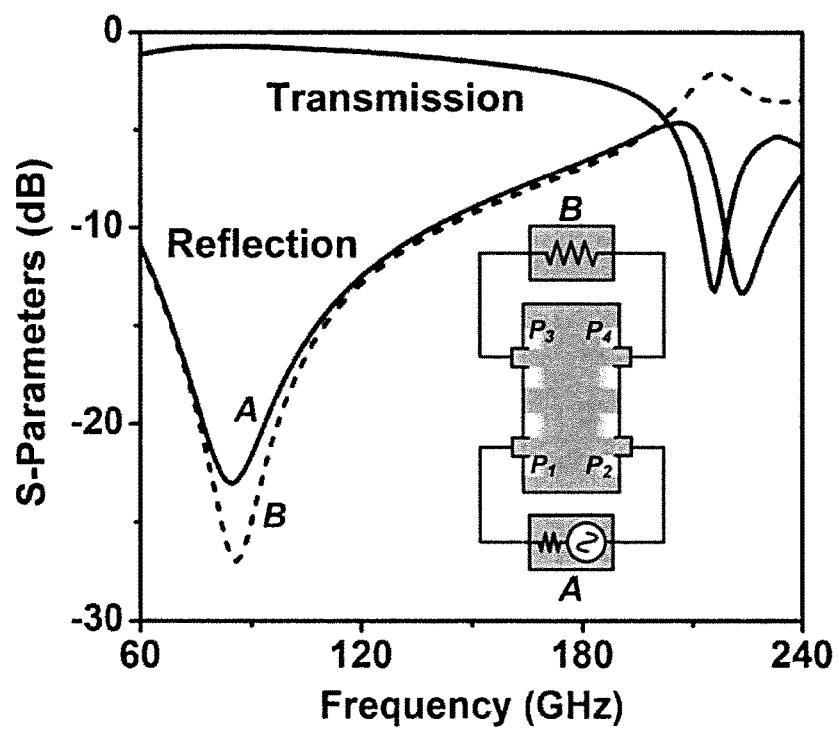
FIG. 8 depicts a simulated insertion loss of an RPGC under differential excitation of a 200-GHz harmonic oscillator. ($f_0$=100 GHz)
Figure 9:
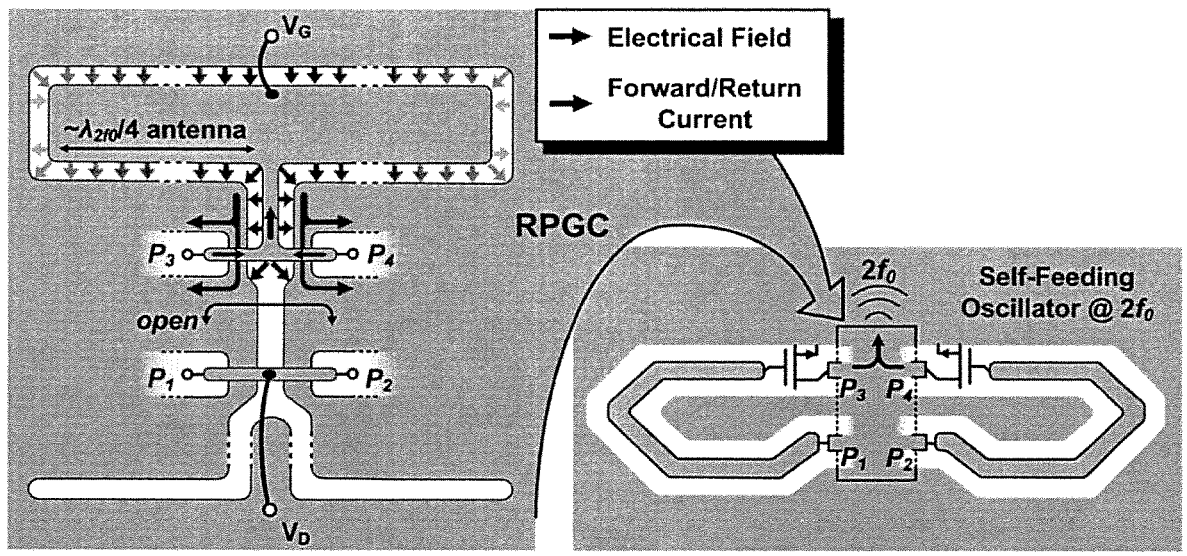
FIG. 9 depicts operation of the RPGC of FIG. 7 at even mode at $2f_0$, with associated E-field and current distribution.
Figure 10:
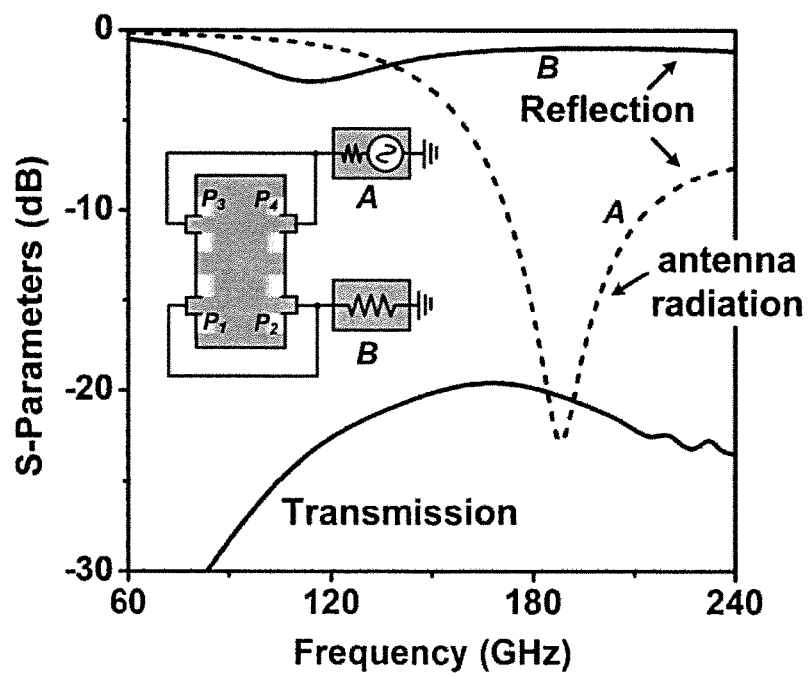
FIG. 10 depicts the electromagnetic and S-parameter simulations of an RPGC inside a 200-GHz harmonic oscillator.

The construction of the RPGC structure requires only one metal layer (plus air gap), although other configurations are possible. Shown in FIG. 8, such a coupler has two input/output port pairs: $P_1$-$P_2$ and $P_3$-$P_4$. The signal lines of each pair are respectively connected. Meanwhile the return paths between the two pairs form a metal gap in the center. As described above, when a signal is transmitted from one port pair to another, a differential component of the signal passes through, while a common-mode component is blocked. The former case is illustrated in FIG. 8, where a differential signal is injected into $P_1$-$P_2$ pair. The forward current on the CPW signal trace flows into the virtual ground "a". Meanwhile, the signal differential return current, in the form of quasi-TEM traveling wave, propagates through the central metal gap and then induces differential forward current from virtual ground "b". The injected signal is therefore extracted from $P_3$ and $P_4$. This means the RPGC structure is transparent to the differential signal along the $P_1$-to-$P_3$ and $P_2$-to-$P_4$ paths. To block the differential current flows on the top/bottom boundaries of the RPGC, two pairs of quarter-wave slots (at $f_0$) are used, which transform the short termination (or virtual ground "c") into open.

On the other hand, for common-mode excitation in the RPGC (e.g., at $P_1$ and $P_2$ in FIG. 6), Nodes a and b behave as open and block the forward current flow. Meanwhile, the return-path gap, like a CPW line with signal trace removed, does not support propagation of the symmetric wave induced by the in-phase return currents. So the common-mode signal is fully blocked between the top/bottom port pairs.

Figure 7:
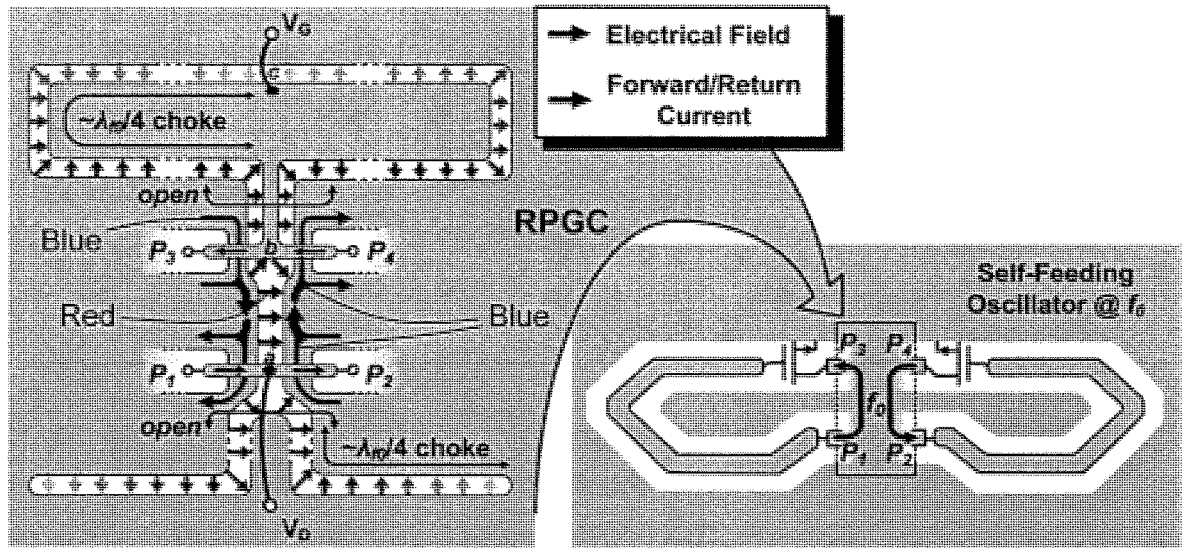
FIG. 7 depicts operation and field/current distribution of the RPGC structure of FIG. 7 in the differential oscillation mode at $f_0$.

To verify the performance of such coupler design, an exemplary coupler was built inside a 100 GHz-to-200 GHz harmonic oscillator (to be shown next). As FIG. 7 shows, the simulated transmission loss for the differential signal at 100 GHz is only 0.6 dB, while the transmission loss (i.e., isolation) for the in-phase signal at 100 GHz is as high as 30 dB. This indicates that a device according to the present disclosure could achieve excellent signal-mode filtering at very high frequency, and can be easily fabricated.

Self-Feeding Harmonic Oscillator Based on Return-Path Gap Coupler

As indicated previously, for differential driving signal is allowed to propagate through the RPGC with a very small transmission loss. Such "transparency" behavior is utilized in the differential, modified self-feeding oscillator in FIG. 7 (as an example, here the oscillation frequency is designed to be $f_0$=100 GHz). In this way, by choosing the correct impedance and length of the self-feeding line, such an oscillator achieves the optimum gate-to-drain phase for the maximum oscillation power at $f_0$. Note that such structure also enables separate gate/drain DC bias.

As indicated previously, the RPGC coupler effectively isolates any in-phase signal from the drain to the gate. The exemplary oscillator utilizes this behavior (shown in FIG. 8) on three important aspects: (i) it prevents the two transistors from oscillating with the undesired in-phase mode at $f_0$; (ii) for the common-mode, $2^{nd}$-harmonic signal generated by the transistors, the drain and gate are fully isolated as previously described.

In addition, to enable integrated radiation functionality, in the exemplary harmonic oscillator, the two quarter-wave (at $f_0$) slots on the top of the RPGC are connected at c: at $2f_0$, they form a typical folded-slot antenna, which radiates the $2^{nd}$-harmonic signal into free space. It is noted that, before radiation, the harmonic signal travels with minimum path, rather than with the long feed lines (for resonance and canceling at $f_0$) in conventional THz oscillators. This greatly reduces the signal loss and chip area. Note that such integrated folded-slot antenna is very broadband and directive. Since the radiation direction is downward through the substrate, an external backside-attached silicon lens can greatly enhance the radiation efficiency.

Figures 15A, 15B:
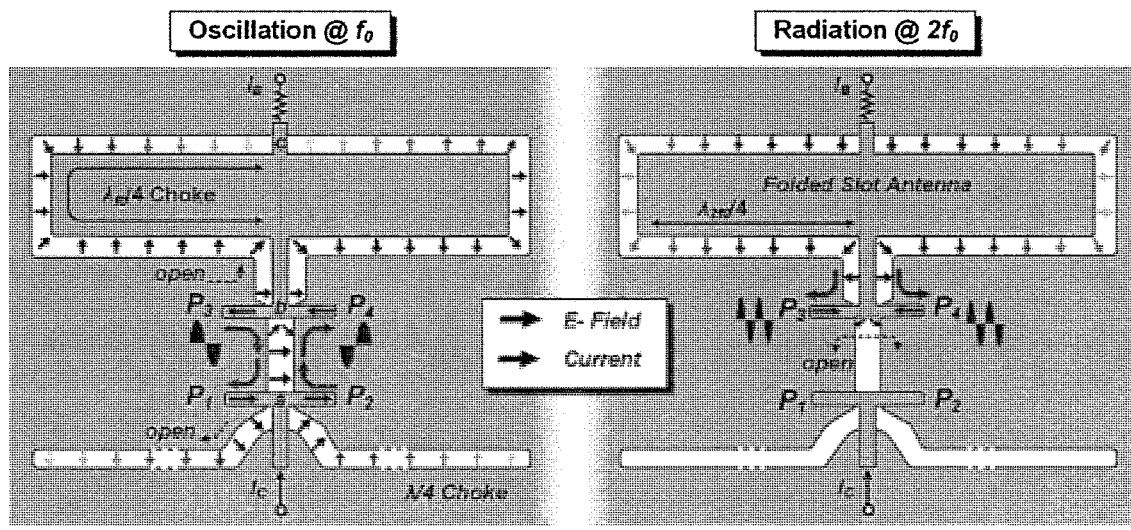
FIG. 15A depicts the electromagnetic field distribution and simulated insertion loss of an RPG structure according to an embodiment of the present disclosure for differential oscillation at $f_0$.
FIG. 15B depicts the electromagnetic field distribution and simulated insertion loss of the RPG structure of FIG. 15A for common-mode harmonic generation/radiation at $2f_0$.

The radiator structure (FIG. 1) comprises two self-feeding oscillator units coupled by a return-path gap ("RPG"). The RPG has four ports. Each two ports at top and bottom are connected in the forward current paths while separated by a metal gap in the return current paths. The RPG permits the transmission of unbalanced (differential) mode wave, while blocking the balanced (common) mode wave. The former case is illustrated in FIG. 15A, where a pair of differential signals is injected into $P_1$ and $P_2$. The forward current on the microstrip signal trace flows into the virtual ground "a". Meanwhile, the differential return current, in the form of quasi-TEM traveling wave, propagates through the central metal gap and then induces differential return (as well as forward) currents in $P_3$ and $P_4$. This means the RPG is transparent to the differential signal along $P_1$-to-$P_3$ and $P_2$-to-$P_4$ paths. To block the wave at the top/bottom boundaries of the RPG, two $\lambda_{f0}/4$ slot pairs transforming short (or virtual ground "c") to open are used. HFSS simulations indicate that for differential signals, the RPG has a transmission loss of only 0.6 dB at $f_0$ (160 GHz). Such broadband transparency forms the feedback paths of the two self-feeding oscillator units (FIG. 1), which provide optimum gain condition (hence maximum oscillation power) for the HBTs with proper impedance and length of the self-feeding lines. Note that the RPG also separates the DC bias of the base and collector of the HBTs.

Next, for the common-mode excitation (FIG. 15B), the central metal gap is like a CPW without signal trace. Propagation of the symmetric wave induced by the in-phase return currents is therefore not supported. Excellent isolation between the two port pairs, shown in the simulation, is obtained. The oscillator utilizes this behavior for three purposes: (i) at $f_0$, the two HBTs cannot oscillate with the undesired in-phase mode; (ii) the generated common-mode $2f_0$ signal is fully isolated between the base and collector; (iii) the slots on the top ($\lambda/4$ at $f_0$) now form a folded-slot antenna at $2f_0$, which instantly radiates the harmonic signal to the chip backside without feed lines. This greatly reduces the signal loss and chip area. The simulated radiation pattern of each radiator is shown in FIG. 17. The estimated radiation efficiency (including the reflection at silicon-to-air interface) is ~50%. Also, the $2f_0$ signal is generated by the nonlinear heterojunction at the base of the HBT. Such technique recycles the fundamental oscillation power dissipated at the base, and efficiently up-converts it to $2f_0$. From the above analysis, it can be seen that through the synthesis and guidance of different electromagnetic wave modes, we have optimized the fundamental oscillation, harmonic generation and radiation with a very compact passive structure.

Because the RPG is "transparent" to differential signals at $f_0$, but blocking and radiating to signals at $2f_0$, the RPGC can be applied to various existing harmonic oscillator topologies. Such oscillators (e.g., the most commonly-used push-push oscillators and differential Colpitts oscillators) have similar behaviors—differential coupling at $f_0$ and harmonic extraction at $2f_0$. Blocking the $2f_0$ signal between the gate and drain of a transistor, as disclosed herein, is advantageous for such harmonic oscillators—providing enhanced efficiency and intrinsic radiation capability.

Exemplary 320 GHz Transmitter

Figure 23:
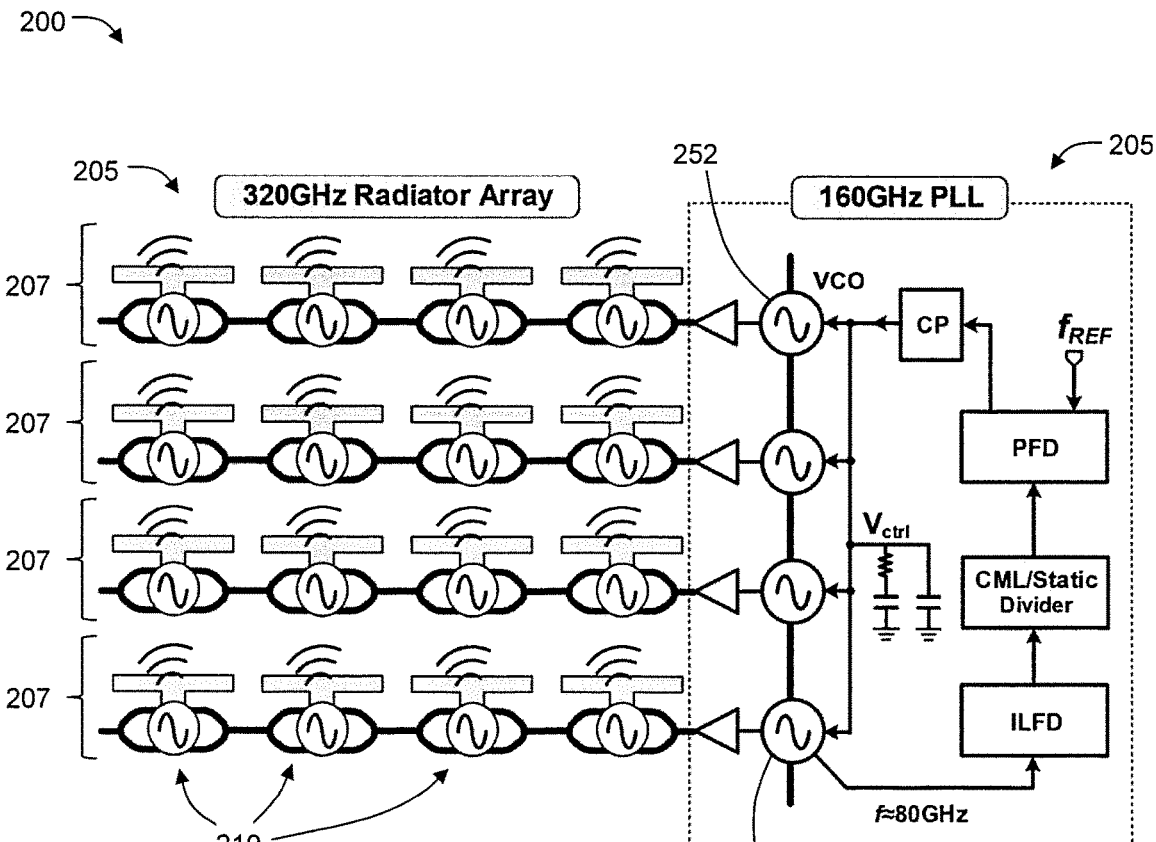
FIG. 23 depicts an exemplary architecture of a 320 GHz transmitter with a fully-integrated phase-locking loop according to another embodiment of the present disclosure, wherein CP is a charge pump, PFD is a phase/frequency detector, CIVIL is current-mode logic, and ILFD is an injection-locking frequency divider.
Figure 24A:
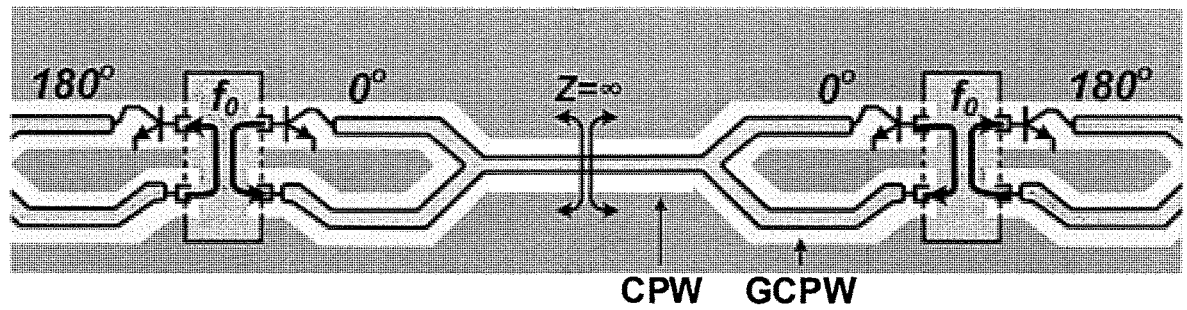
FIG. 24A depicts mutual coupling between adjacent radiators of the transmitter of FIG. 23 for an in-phase coupling mode (supported)
Figure 24B:
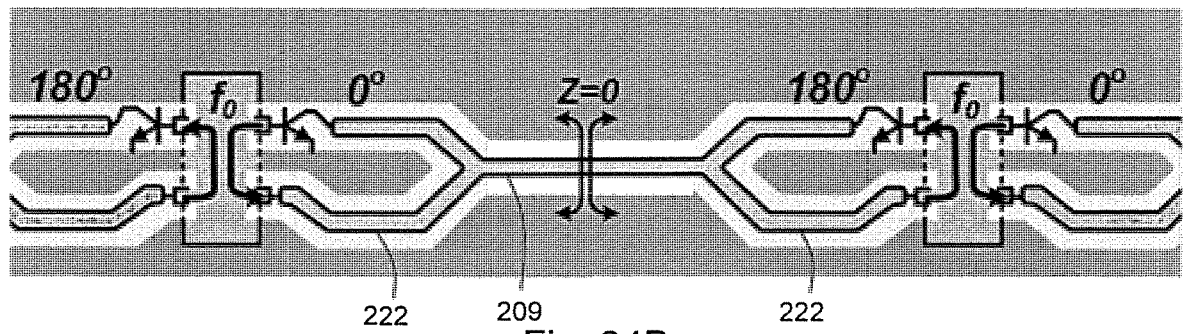
FIG. 24B depicts mutual coupling between adjacent radiators of the transmitter of FIG. 23 for an out-of-phase coupling mode (unsupported)

The proposed RPGC-based THz radiator is integrated into a 4×4 array of a 320 GHz transmitter for heterodyne imaging system (shown in FIG. 23). Compared to the incoherent fully-intensity-based detection, where the incident THz wave undergoes a self-mixing, in a heterodyne receiver (not implemented in this work) it is mixed with an LO signal with much larger power. The output response, as well as the imaging sensitivity, is therefore greatly enhanced. A heterodyne multi-pixel system also enables electronic beam scanning, because each receiver pixel preserves the phase of the incident THz wave, and the signal phase shifting/combining can be then performed in the digital domain. This could potentially eliminate the needs for the mechanical scanning in conventional THz imaging systems. To perform heterodyne detection in such an imaging system, it is critical to lock the phase of the RF signal in the transmitter and the LO signal in the receiver. To achieve this goal, in FIG. 23, the 16-element radiator array is phase-locked by a fully-integrated PLL through injection locking at 160 GHz. Next, design details of some critical transmitter elements are given.

Coupled Radiator Array

Although the disclosed return-path gap structure optimizes the generation of THz radiation, the absolute power level from a single radiator is still limited by the HBT size. Therefore, a 16-element array is implemented for increasing the total radiated power. The power combining is obtained through the constructive superposition of the radiated waves in the far field. Such quasi-optical power combining is efficient, broadband, and highly scalable. The array is partitioned into four rows, inside which elements are passively coupled. The mutual coupling between radiators is through a CPW transmission line tapping on the self-feeding lines of the radiators (shown in FIGS. 24A and 24B). By symmetry, there are in-phase and out-of-phase coupling modes in the steady state. In the in-phase coupling mode (FIG. 24A), the boundary between two units is equivalent to an open termination, hence the added CPW lines behave as shunted capacitors. To minimize the impact of such capacitors, the signal path of the CPW lines is designed to be very narrow (W=3 μm) and far from the ground plane (D=6 μm). On the other hand, the out-of-phase mode (FIG. 24B) leads to a virtual ground at the connector of the coupling lines. It presents a highly inductive susceptance in shunt with the self-feeding lines, which greatly reduces the oscillation power. This undesired mode is therefore automatically suppressed. The above analyses assume that all radiator units are identical. According to Adler's equation, if their free-running oscillation frequencies are different, a phase shift between the adjacent units occurs with the injection locking. Nevertheless, such undesired phase shift is not significant in the instant design, because of the small mismatch of the free-running oscillation frequencies (verified by the measurement shown in FIGS. 31A and 31B) and the strong coupling strength.

Figure 25:
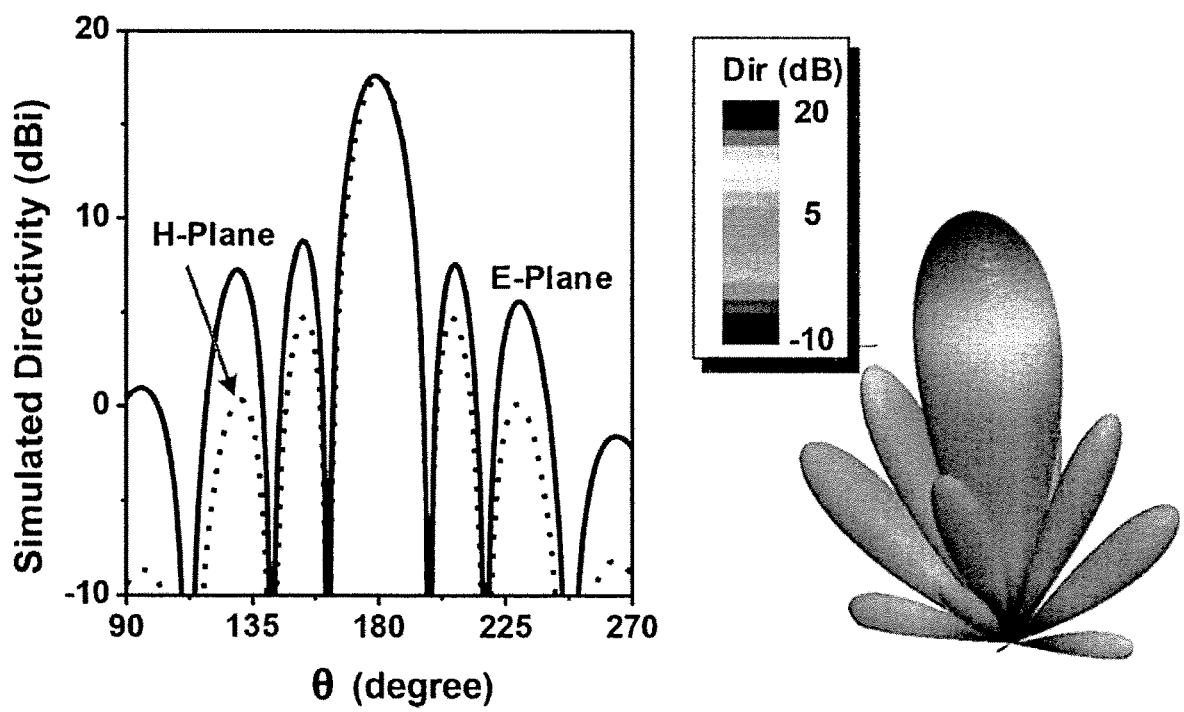
FIG. 25 depicts a simulated radiation pattern of the 320 GHz 4×4 radiator array of the transmitter of FIG. 23, wherein the pitch between the elements is 220 μm, and having a backside hemispheric silicon lens.

Due to the compactness of the presently-disclosed radiator, the entire 16-element array, equipped with functions of fundamental oscillation, harmonic generation, and radiation, only occupies an area of 0.9×0.9 mm². As a result, the achieved radiator density is ~4× higher than the previous designs. The small radiator pitch also suppresses the side lobes of the combined beam. The simulated radiation pattern of the array, with a directivity of 17.6 dBi, is shown in FIG. 25. This again assumes that a hemispheric silicon lens is attached on the back side. The simulated directivity without the lens is ~12 dBi.

On-Chip Phase-Locked Loop

Figure 26:
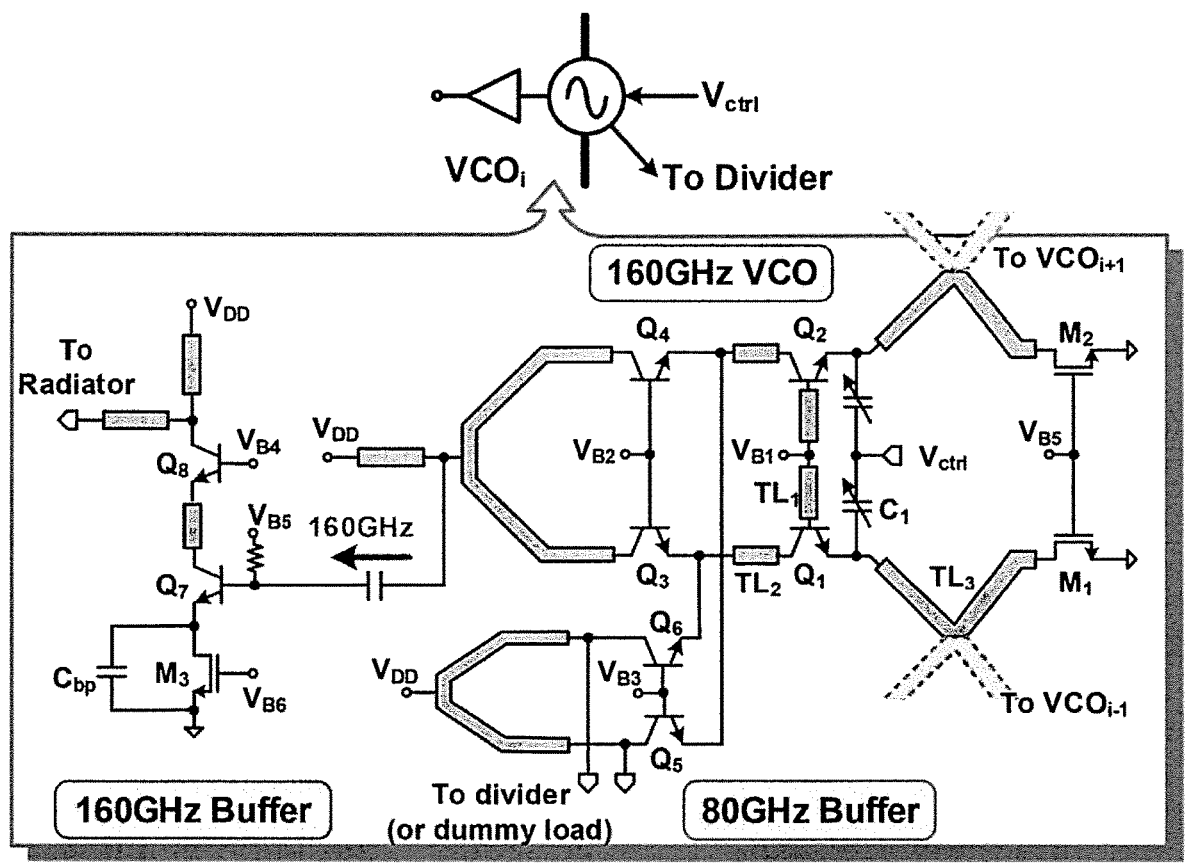
FIG. 26 is a schematic of a 160 GHz voltage-controlled oscillator inside an on-chip phase-locked loop of a transmitter according to an embodiment of the present disclosure.

Shown in FIG. 23, the on-chip PLL consists of four coupled 80 GHz VCOs, providing their $2^{nd}$-harmonic (160 GHz) signal to synchronize each radiator row via injection locking. A divider chain samples the phase/frequency of the VCO linear array and then a global phase/frequency control signal $V_{ctrl}$ is provided through a phase detector cascaded by a charge pump. FIG. 26 presents the schematic of the VCO, including two output buffers at 80 GHz and 160 GHz. In principle, heterodyne imaging uses a single-tone wave, and does not require frequency tunability. However, in practice, this can still be used to cover the process variability between the transmitter and receiver. In conventional cross-coupled VCO, the large, untunable $C_\pi$ is in parallel with the varactor. So, in order to increase the tunability, the size of the lossy varactor should also be large, which is detrimental to the oscillation power. To obtain a better tradeoff between the oscillation power and tuning range, our 80 GHz VCO is based on a differential Colpitts oscillator topology, in which the resonance tank on one side of the VCO is mainly formed by the transmission line stub $TL_1$, MOS varactor $C_1$, and the $C_\pi$ of the HBT transistor $Q_1$. Compared to the cross-coupled topology, the varactor $C_1$ is in series with $C_\pi$; so, for the same HBT size and tuning range (~6 GHz in simulation), we can use a smaller varactor and increase the oscillation swing.

The 80 GHz VCO has two common-base cascode stages in parallel ($Q_3$~$Q_6$). $Q_3$ and $Q_4$ provide low-impedance terminations to the collectors of $Q_1$ and $Q_2$, which is required by the three-point nature of Colpitts oscillators. Meanwhile, $Q_3$ and $Q_4$ also increase the generation of the $2^{nd}$-harmonic signal at 160 GHz, which is then further amplified by a cascode buffer stage $Q_7$ and $Q_8$. The signal is then injected into the radiator array through the CPW coupling line of the rightmost radiator. For the VCO at the bottom row in FIG. 23, $Q_5$ and $Q_6$ are used as a differential buffer to provide the 80 GHz output to the divider chain inside the PLL. The transmission line $TL_2$ is for tuning out the capacitance presented by the emitters of $Q_3$~$Q_6$. Lastly, three 130 nm MOSFETs $M_1$~$M_3$ are used to regulate the HBT currents. These MOSFETs have big size, and $TL_3$ at the emitter of $Q_1$ is used to transform the large drain capacitance of $M_1$ into a weakly inductive impedance, so that the tuning range and oscillation power of the VCO are not reduced.

The adjacent VCOs are strongly coupled through a direct connection of the intermediate nodes of $TL_3$ (FIG. 23). Similar to the radiator coupling described above, the VCOs are coupled with in-phase mode, and the coupling junction at $TL_3$ presents open, hence has no impact in the steady state to the VCOs. Since each VCO is coupled to its neighbors, and the only global signal is the low-frequency varactor bias control $V_{ctrl}$, this proposed PLL architecture is highly scalable, and can accommodate even bigger radiator size for higher output power.

As FIG. 23 shows, the frequency divider chain of the PLL comprises injection-locking dividers (80 GHz to 10 GHz), CIVIL dividers (10 GHz to 1.25 GHz), and a static divider, with a total division ratio of 256. The loop bandwidth is ~2 MHz. The phase of the radiated wave at 320 GHz is then locked to an externally applied reference clock at ~310 MHz.

Prototype and Experimental Results

Figure 27:
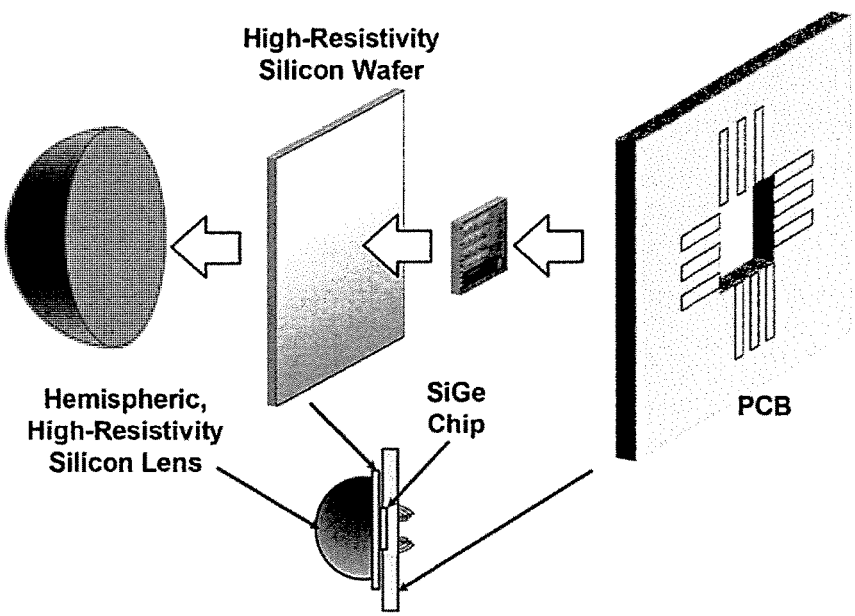
FIG. 27 depicts an exemplary chip package with backside attachment of a silicon lens.
Figure 28A:
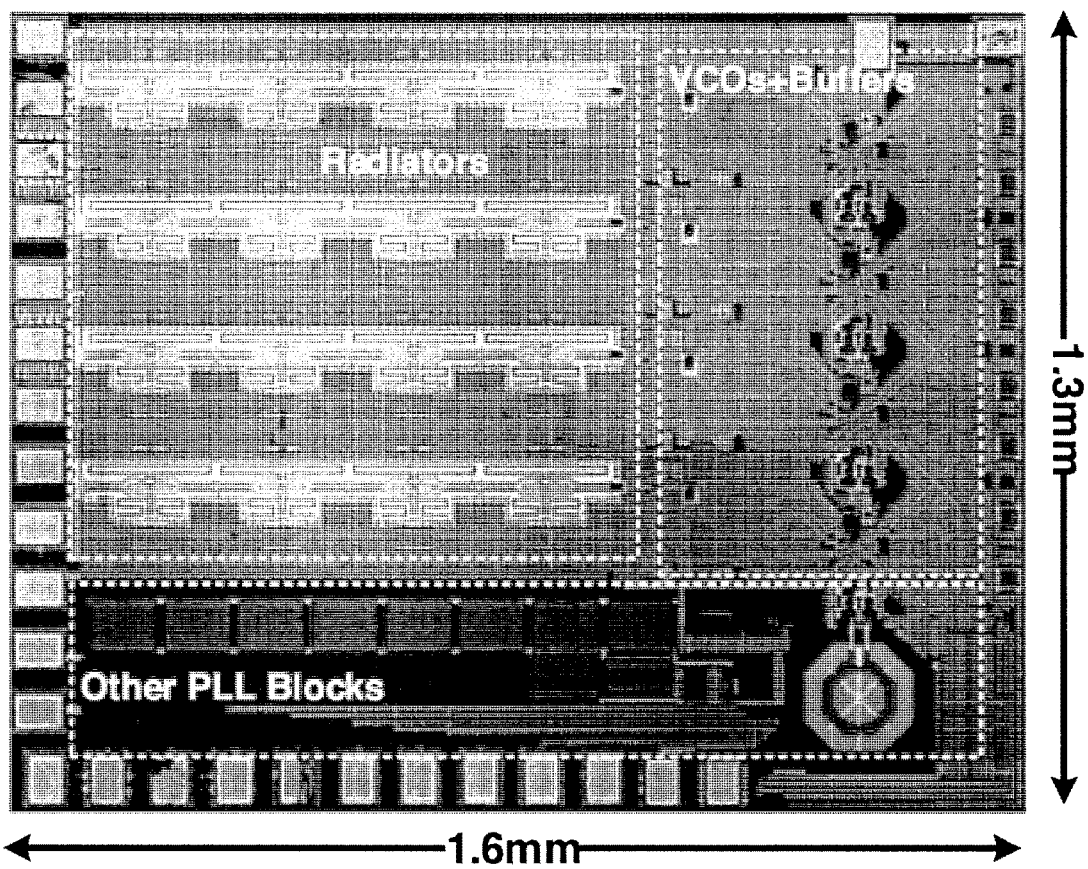
FIG. 28A is a microphotograph of an exemplary 320 GHz transmitter using 130-nm SiGe BiCMOS process.
Figure 28B:
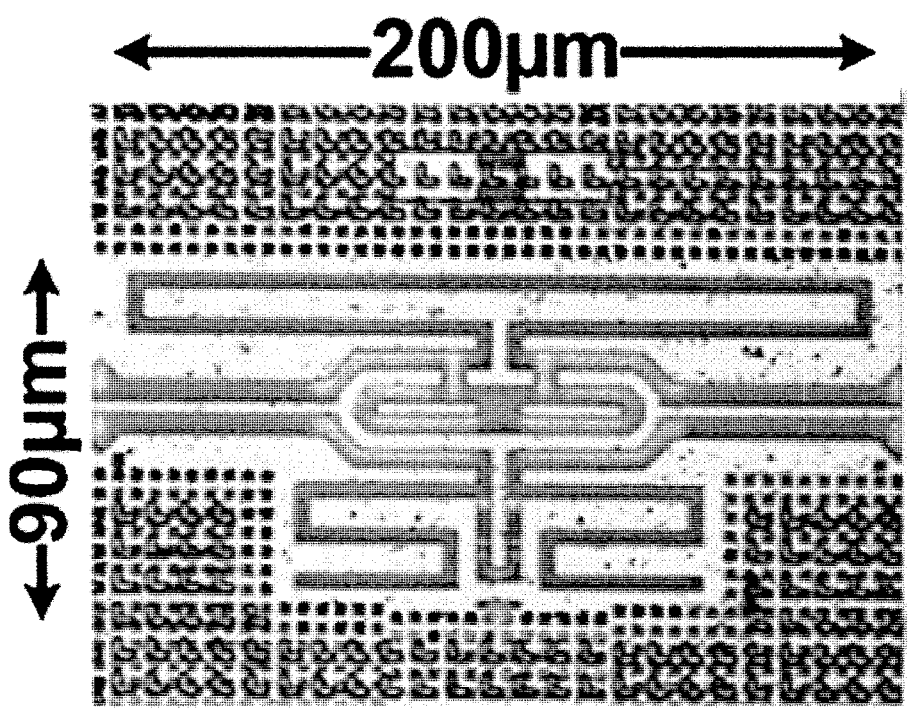
FIG. 28B is a microphotograph of a THz radiator based on an embodiment of the presently-disclosed return-path gap coupler used in the array of the transmitter of FIG. 27A.

The exemplary 320 GHz transmitter is implemented using the STMicroelectronics 130-nm SiGe:C BiCMOS process. The micrographs of the chip, as well as a radiator unit, are shown in FIGS. 28A and 28B. The entire chip, including the 4×4 radiator array and the PLL, occupies an area of 1.6×1.3 mm². The packaging is shown in FIG. 27. First, the chip is mounted onto a high-resistivity silicon wafer (~0.3 mm thick and ~1 cm² large). The wafer is then glued to a PCB with a hole, so that the exposed front side of the chip is wire-bonded to the metal leads on the PCB for the connections of DC power, bias, and the PLL reference clock signal. Finally, a hemispheric, high-resistivity silicon lens (with a diameter of 1 cm) is attached on the other side of the wafer. The insertion of the high-resistivity wafer between the chip and the lens allows for easy alignment. Although the radiator is not located exactly at the spherical center of the lens, the beam collimation due to such offset is still not significant for two reasons: (1) the offset is much smaller than the lens diameter (0.5 mm versus 1 cm). (2) The beam is concentrated in the perpendicular direction, for which the refraction (at the lens surface) due to the offset is minimal.

Figure 29:
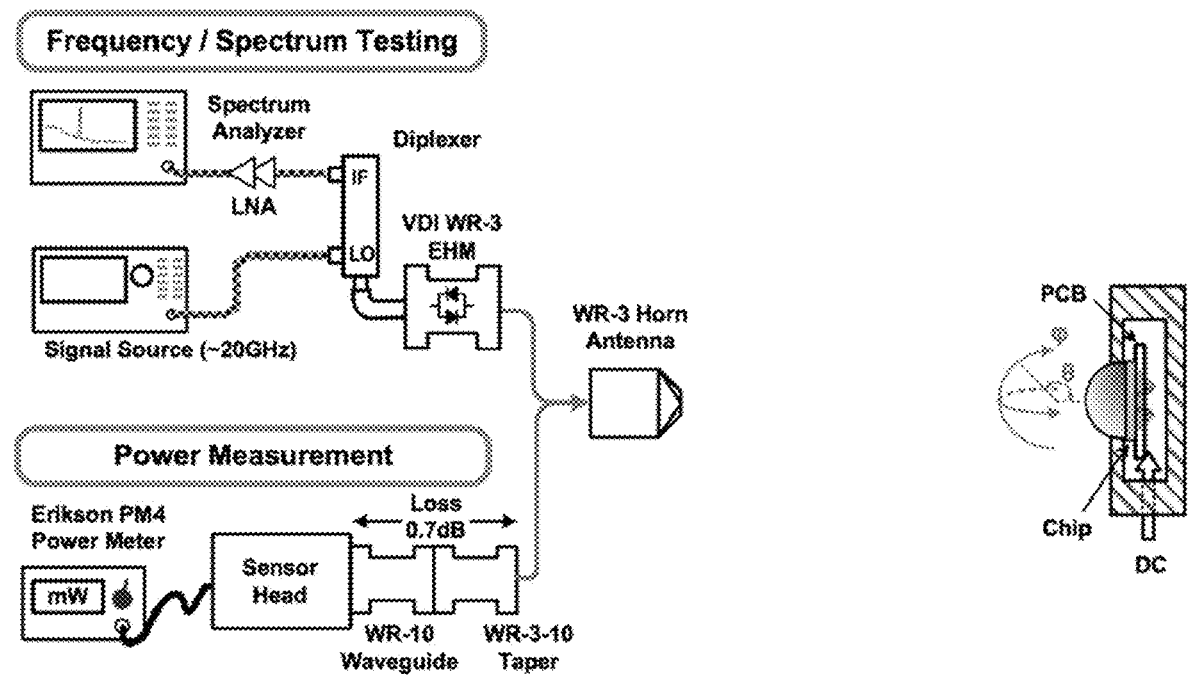
FIG. 29 depicts the measurement setup used to characterize the transmitter of FIG. 27A.
Figure 30:
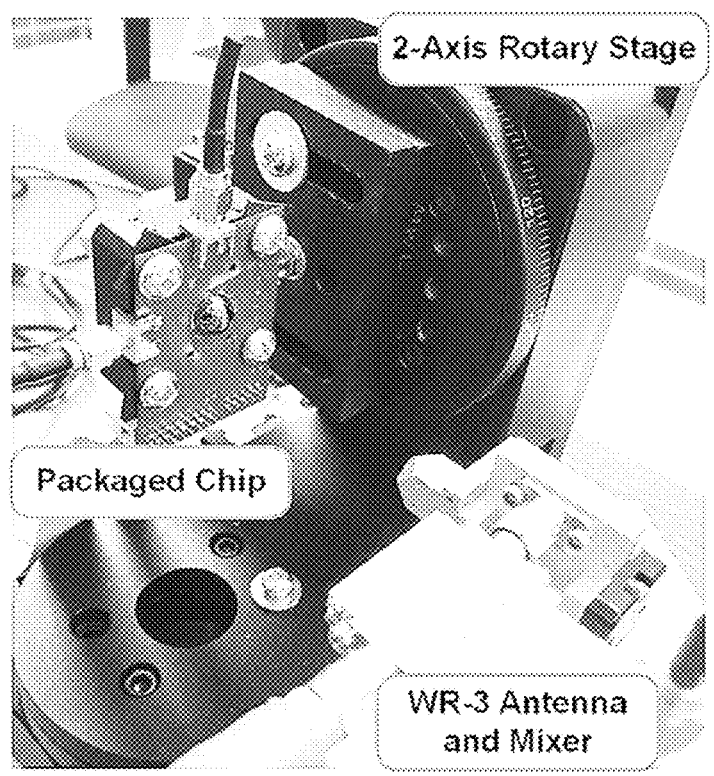
FIG. 30 is a photograph of the packed chip.

The measurement setup is shown in FIGS. 29-30. The output THz beam of the chip is received by a diagonal horn antenna. For testing the frequency and spectrum of the radiation, a VDI WR-3.4 even-harmonic mixer (EHM) is used to mix the input THz signal with the $16^{th}$ harmonic of an externally-applied LO signal (~20 GHz). The measured spectrum of the down-converted IF output is shown in FIGS. 31A-31B. When the on-chip PLL is turned off, the radiator rows are not synchronized and oscillate at their own free running oscillation frequencies. This is indicated in the multiple spurs in FIG. 31A. The number of spurs does not equal the number of the radiator rows (N=4); this may be due to the mutual pulling between the adjacent rows through the silicon substrate. When the on-chip PLL is turned on, a single, coherent radiation is measured, as shown in the spectrum in FIG. 31B. Due to the constructive power combining, the output power is 7-dB higher than the radiation measured in the former case. Such locking works over a small frequency range (0.2 GHz) due to the large oscillation power of the THz radiator array compared to the relatively small injection strength from the 160 GHz PLL. The measured phase noise of the radiation is −79 dBc/Hz at 1 MHz offset.

Next, to measure the absolute power of the radiation, an Erikson power meter (with a WR-10 input) is used, which provides enhanced accuracy compared to the power measurements using highly nonlinear and lossy harmonic mixers. Shown in FIG. 29, an additional 1" WR-10 waveguide is used to protect the metal flange of the sensor head, and another 1" WR-10 to WR-3.4 taper is used to connect to the horn antenna with a smooth transition. The total loss of such additional connection is 0.7 dB. To begin with, the distance between our transmitter and the horn antenna, d, is changed from 4 cm to 9 cm. The associated power received by the horn antenna, $P_r$, is plotted in FIG. 21. It can be seen that when the distance is larger than 6 cm, the roll-off of the received power complies with the Friis transmission equation ($P_r \propto d^{-2}$). Because of this, all the subsequent measurements are based on the far-field distance limit of 6 cm. With this distance, the received power is 61 μW, resulting in a transmitter effective isotropic radiated power (EIRP) of 22.5 dBm.

Figure 33A:
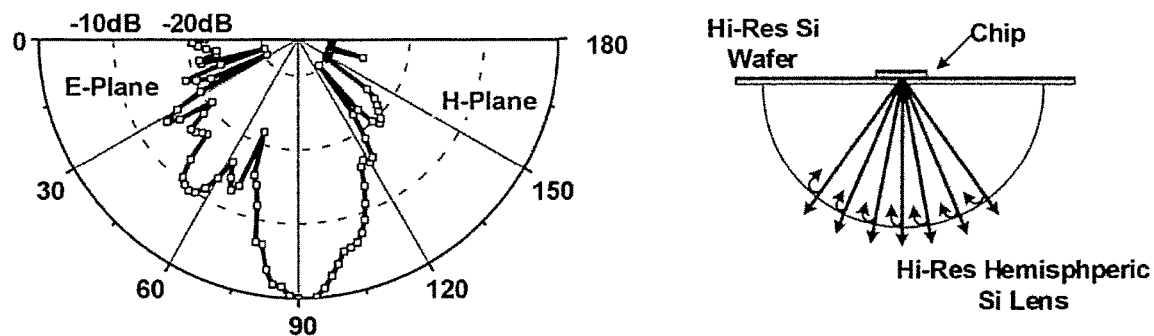
FIG. 33A shows the measured radiation patterns of the exemplary 320 GHz transmitter with a hemispheric silicon lens attached at the back of the chip.
Figure 33B:
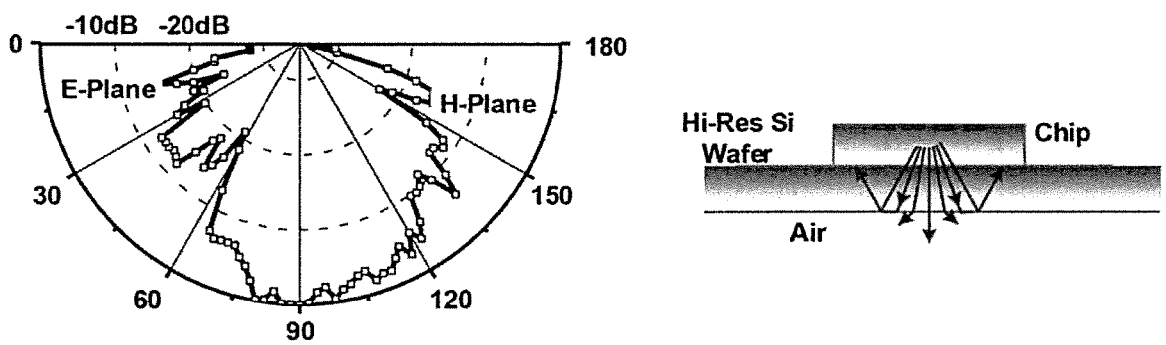
FIG. 33B shows the measured radiation patterns of the exemplary 320 GHz transmitter via direct backside radiation without a silicon lens

Using the harmonic mixer, the radiation pattern of the transmitter is measured by rotating the chip in both azimuth φ and elevation θ directions (FIG. 29). When the silicon lens is attached on the back side of the chip, the radiation pattern is shown in FIG. 33A. The measured directivity is 17.3 dBi and the 3 dB beamwidth is ~20°. Such high directivity is due to the coherent 16-element array configuration, and is consistent with the simulation presented in above. In addition, the radiation performance without the backside silicon lens is also characterized. It is expected that the output beam will undergo more divergence at the silicon-to-air interface, due to the more significant refraction near the critical angle ($\theta_c = 16°$). Nevertheless, the measured pattern shown in FIG. 33B still has a high directivity of 13 dBi, with an associated 3-dB beamwidth of ~54° (H-plane) and ~26° (E-plane). The asymmetric profile is due to the different reflection rates for s-polarized wave and p-polarized wave.

Figure 34:
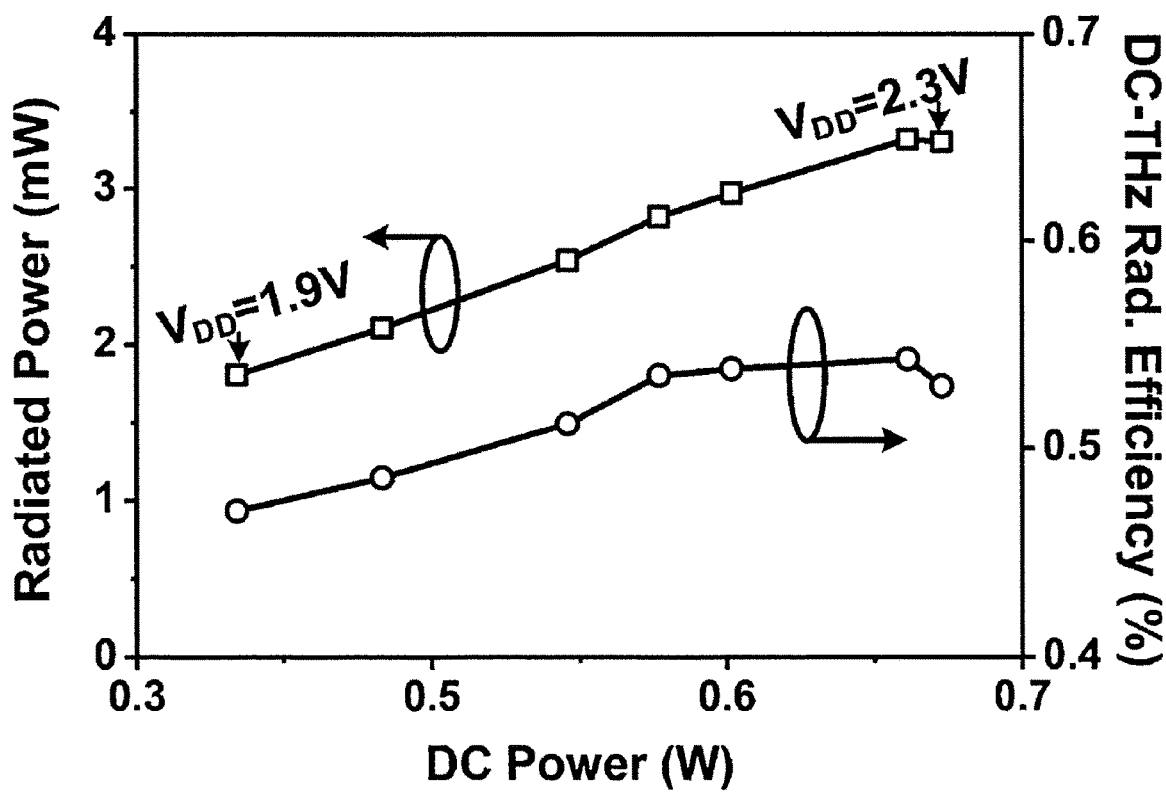
FIG. 34 shows the total radiated power of the exemplary 320 GHz transmitter, as well as the associated DC-to-THz radiation efficiency, at different DC power supply voltages and dissipation power.

Finally, the supply voltage of the transmitter, $V_{DD}$, is swept. The associated total radiated power, DC power consumption, as well as the DC to THz radiation efficiency, are plotted in FIG. 34. Here, the total radiated power of the chip equals to the measured EIRP subtracted by the measured directivity. At the $V_{DD}$ of 2.15 V, the total radiated power reaches its maximum of 5.2 dBm (3.3 mW), and the associated DC power is 610 mW. This leads to a DC to THz radiation efficiency of 0.54%. It is noteworthy that even when the backside silicon lens is removed, the measured total radiated power and the DC to THz radiation efficiency are still as high as 0.9 dBm (1.2 mW) and 0.2%, respectively. The relatively small degradation indicates that when a highly directive beam (perpendicular to the silicon-air interface) is generated from a large-array configuration, the undesired impact of the substrate-mode wave is less significant.

In FIG. 35, the performance of the proposed transmitter is summarized and compared with the other state-of-the-art THz radiators in silicon. It can be seen that this work achieves the highest radiated power and DC to THz radiation efficiency. These two metrics (when no silicon lens is used) are also the highest among the sources without silicon lens or non-standard wafer thinning. These clearly demonstrate that the proposed compact radiator design based on the return-path gap coupler has fully optimized the THz generation potential of the silicon transistors. Please note that the proposed device analysis approach and radiator design can also be applied to CMOS and other III-V integrated circuit technologies. While a first THz on-chip PLL was previously presented, but the output signal of the PLL was measured through wafer probing. To the best of our knowledge, the present disclosure is the first demonstration of fully-integrated phase locking for THz radiation sources, which is a critical step towards future THz sensing microsystems.

Although the present disclosure has been described with respect to one or more particular embodiments, it will be understood that other embodiments of the present disclosure may be made without departing from the spirit and scope of the present disclosure. Hence, the present disclosure is deemed limited only by the appended claims and the reasonable interpretation thereof.

What is claimed is:

1. A terahertz radiator, comprising:
    two oscillators operating at a fundamental frequency ($f_0$), each oscillator having a feedback path; and
    a coupler on the feedback paths of the oscillators, wherein the coupler is configured to be transparent to a differential signal at $f_0$ and blocking to an in-phase signal at a harmonic of $f_0$.

2. The terahertz radiator of claim 1, wherein $f_0$ is a frequency from 100 GHz and 200 GHz.

3. The terahertz radiator of claim 1, wherein the two oscillators are self-feeding oscillators.

4. The terahertz radiator of claim 1, wherein the two oscillators are configured to be a push-push oscillator or a differential Colpitts oscillator.

5. The terahertz radiator of claim 1, wherein the two oscillators are configured to provide differential coupling at $f_0$ and harmonic extraction at $2f_0$.

6. The terahertz radiator of claim 1, wherein the coupler comprises two pairs of ports, each pair of ports having a first port and a second port, wherein a first signal path connects the corresponding first ports of each pair of ports, a second signal path connects the corresponding second ports of each pair of ports, and a gap is disposed in a first return path and a second return path corresponding to the first signal path and the second signal path respectively.

7. The terahertz radiator of claim 6, wherein each oscillator comprises a transistor having a base in electrical communication with a corresponding first port of the coupler, a collector in electrical communication with a corresponding second port of the coupler, and an emitter.

8. The terahertz radiator of claim 7, wherein each transistor is a heterojunction bipolar transistor ("HBT").

9. The terahertz radiator of claim 7, wherein transmission lines connect each collector of the transistors to the corresponding second ports of the coupler.

10. The terahertz radiator of claim 9, wherein the transmission lines are grounded coplanar waveguides ("GCPWs").

11. A terahertz transmitter, comprising:
    an array of radiators according to claim 1, the array comprising at least one row of radiators, wherein each radiator of the at least one row is coupled to adjacent radiators by connection on the feedback paths of the oscillators;
    a phase-locked loop ("PLL"), having at least one voltage-controlled oscillator ("VCO") in electrical communication with a radiator of the at least one row of radiators, the VCO operating at a VCO frequency and configured to injection lock the radiators of the at least one row.

12. The terahertz transmitter of claim 11, wherein the array of radiators comprises sixteen radiators arranged in four rows of four radiators each, and wherein the PLL comprises four mutually-coupled VCOs, each VCO in electrical communication with a corresponding row of radiators.

13. The terahertz transmitter of claim 11, wherein the radiators are injection locked at a harmonic of a VCO frequency.

14. The terahertz transmitter of claim 13, wherein the VCO frequency is 80 GHz and the radiators are injection locked at 160 GHz.

15. The terahertz transmitter of claim 1, wherein the coupler is a return path gap coupler ("RPGC").

16. The terahertz radiator of claim 15, further comprising a quarter-wave choke at the $f_0$ at each of two ends of the RPGC, and wherein one of the chokes is further configured as a slot antenna at a second harmonic of the fundamental frequency to radiate a second harmonic signal of the oscillators.

* * * * *